United States Patent
Kim et al.

(10) Patent No.: US 11,387,255 B2
(45) Date of Patent: Jul. 12, 2022

(54) SEMICONDUCTOR DEVICE

(71) Applicant: Samsung Electronics Co., Ltd., Suwon-si (KR)

(72) Inventors: Jintae Kim, Daejeon (KR); Ha-Young Kim, Seoul (KR); Sinwoo Kim, Hwaseong-si (KR); Moo-Gyu Bae, Incheon (KR); Jaeha Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/989,160

(22) Filed: Aug. 10, 2020

(65) Prior Publication Data

US 2021/0126014 A1    Apr. 29, 2021

(30) Foreign Application Priority Data

Oct. 24, 2019   (KR) .......................... 10-2019-0133243

(51) Int. Cl.
*H01L 27/11597* (2017.01)
*H01L 27/108* (2006.01)
*H01L 27/11524* (2017.01)
*H01L 27/06* (2006.01)

(52) U.S. Cl.
CPC .. *H01L 27/11597* (2013.01); *H01L 27/10844* (2013.01); *H01L 27/0688* (2013.01); *H01L 27/11524* (2013.01)

(58) Field of Classification Search
None
See application file for complete search history.

(56) References Cited

U.S. PATENT DOCUMENTS

| | | | |
|---|---|---|---|
| 8,546,913 B2 | 10/2013 | Wada et al. | |
| 8,789,000 B1 | 7/2014 | Rashed et al. | |
| 10,157,922 B2 | 12/2018 | Lin et al. | |
| 10,379,600 B2 | 8/2019 | Park | |
| 10,916,535 B2* | 2/2021 | Do | G03F 1/36 |
| 2016/0300851 A1* | 10/2016 | Kim | H01L 27/0207 |
| 2018/0151496 A1 | 5/2018 | Biswas et al. | |
| 2018/0218107 A1 | 8/2018 | Delk et al. | |
| 2018/0314785 A1 | 11/2018 | Schultz | |
| 2018/0350791 A1* | 12/2018 | Do | H01L 27/11807 |
| 2019/0268000 A1* | 8/2019 | Song | H01L 23/528 |
| 2020/0388617 A1* | 12/2020 | Ramaswamy | H01L 27/0688 |

FOREIGN PATENT DOCUMENTS

| KR | 100772269 B1 | 11/2007 |
|---|---|---|
| KR | 1020080097032 A | 11/2008 |
| KR | 20170070405 A | 6/2017 |

* cited by examiner

*Primary Examiner* — Steven M Christopher
(74) *Attorney, Agent, or Firm* — Muir Patent Law, PLLC

(57) ABSTRACT

Disclosed is a semiconductor device comprising a logic cell that is on a substrate and includes first and second active regions spaced apart from each other in a first direction, first and second active patterns that are respectively on the first and second active regions and extend in a second direction intersecting the first direction, gate electrodes extending in the first direction and running across the first and second active patterns, first connection lines that are in a first interlayer dielectric layer on the gate electrodes and extend parallel to each other in the second direction, and second connection lines that are in a second interlayer dielectric layer on the first interlayer dielectric layer and extend parallel to each other in the first direction.

20 Claims, 25 Drawing Sheets

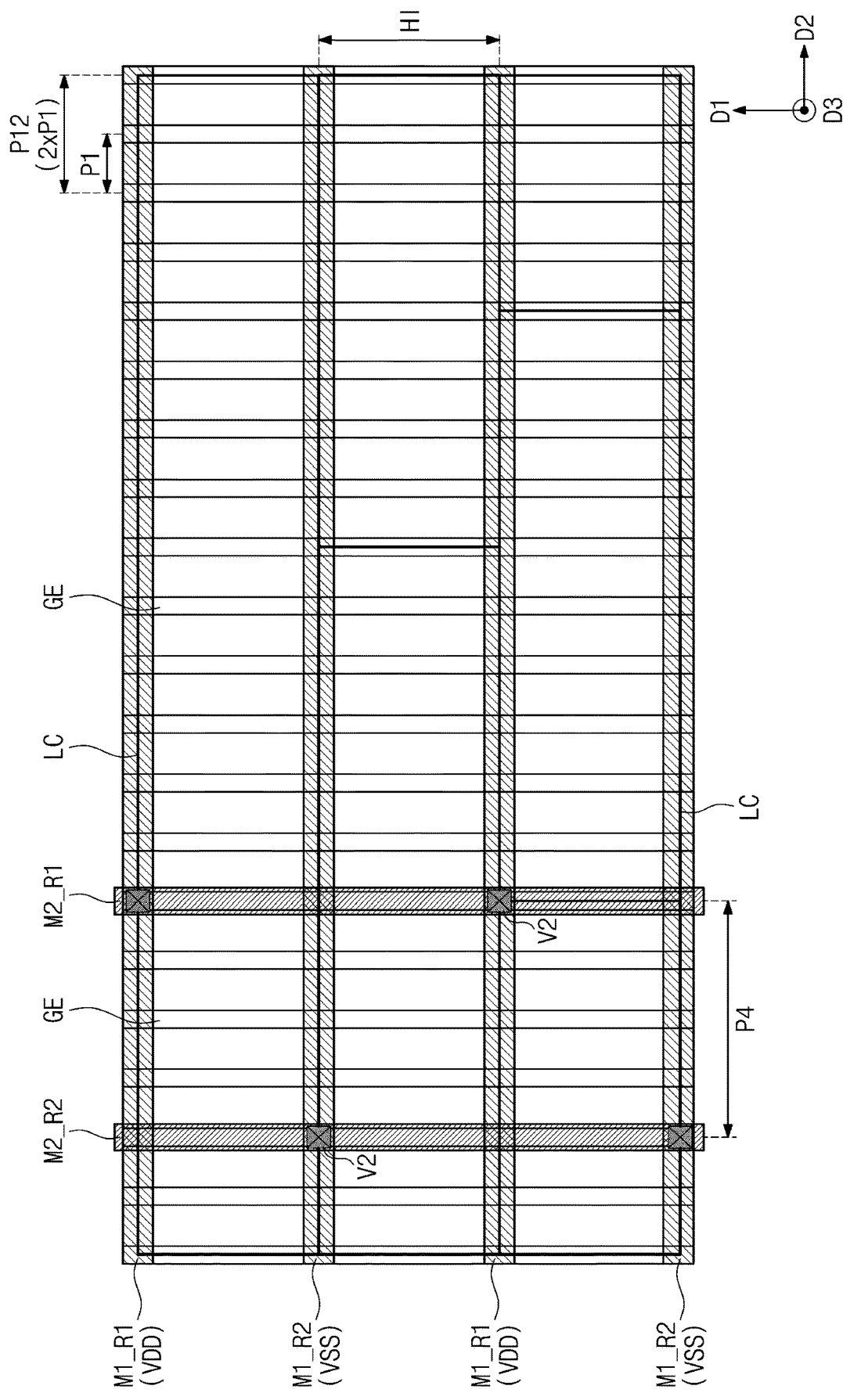

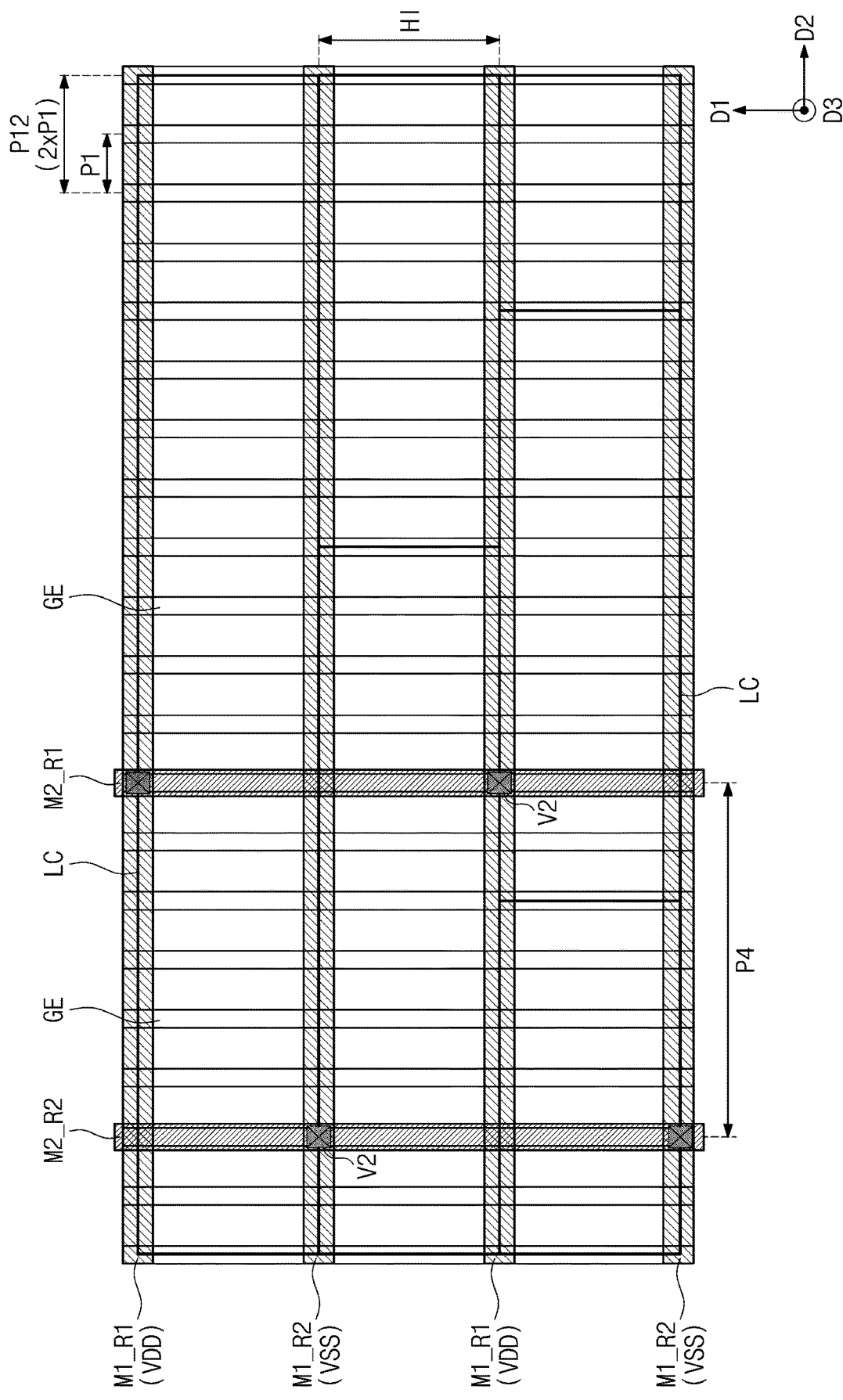

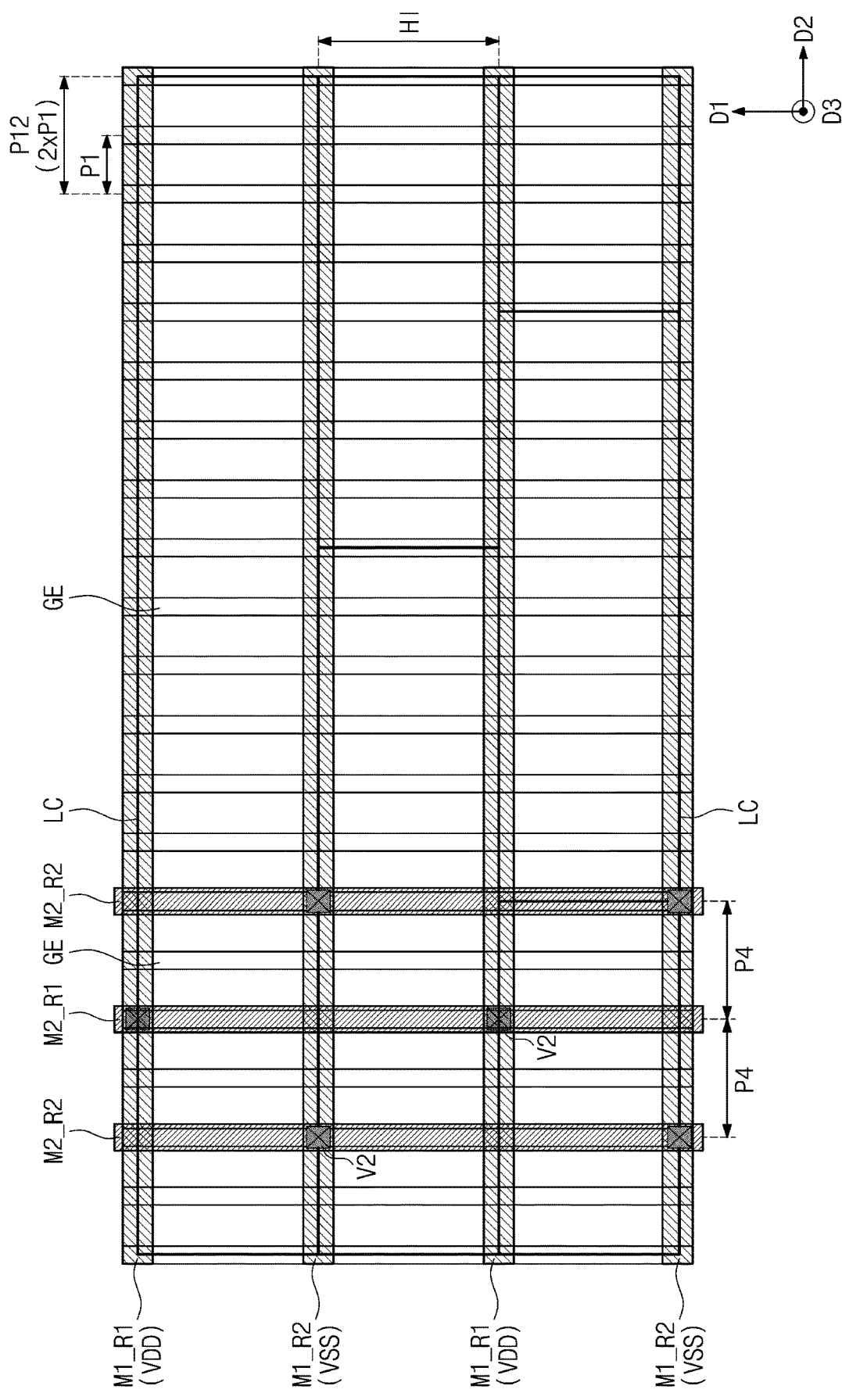

SEMICONDUCTOR DEVICE

CROSS-REFERENCE TO RELATED APPLICATION

This U.S. nonprovisional application claims priority under 35 U.S.C § 119 to Korean Patent Application No. 10-2019-0133243 filed on Oct. 24, 2019, in the Korean Intellectual Property Office, the disclosure of which is hereby incorporated by reference in its entirety.

BACKGROUND

The present inventive concepts relate to a semiconductor device, and more particularly, to a semiconductor device including a field effect transistor.

Semiconductor devices are beneficial in the electronic industry because of their small size, multi-functionality, and/or low fabrication cost. Semiconductor devices may encompass semiconductor memory devices storing logic data, semiconductor logic devices processing operations of logic data, and hybrid semiconductor devices having both memory and logic elements. Semiconductor devices have been increasingly required for high integration with the advanced development of the electronic industry. For example, semiconductor devices have been increasingly requested for high reliability, high speed, and/or multi-functionality. Semiconductor devices have been gradually complicated and integrated to meet these requested characteristics.

SUMMARY

Some example embodiments of the present inventive concepts provide a semiconductor device including a field effect transistor with enhanced electrical characteristics.

According to some example embodiments of the present inventive concepts, a semiconductor device may comprise: a logic cell on a substrate, the logic cell including a first active region and a second active region that are spaced apart from each other in a first direction; a first active pattern and a second active pattern on the first active region and the second active region, respectively, the first and second active patterns each extending in a second direction that intersects the first direction; a plurality of gate electrodes that extend in the first direction and that each run across the first active pattern and the second active pattern, a plurality of first connection lines in a first interlayer dielectric layer on the gate electrodes; the first connection lines extending parallel to each other in the second direction; and a plurality of second connection lines in a second interlayer dielectric layer on the first interlayer dielectric layer, the second connection lines extending parallel to each other in the first direction. The logic cell may have a first cell boundary and a second cell boundary that extend in the second direction. The first cell boundary and second cell boundary may be opposite to each other in the first direction. The first connection lines may include: a first lower power line that extends along the first cell boundary; and a second lower power line that extends along the second cell boundary. The second connection lines may include: a first upper power line that vertically overlaps a first gate electrode of the gate electrodes; and an upper line disposed between the first gate electrode and a second gate electrode of the gate electrodes, when viewed in a plan view. The first upper power line may be electrically connected to at least one of the first lower power line and the second lower power line.

According to some example embodiments of the present inventive concepts, a semiconductor device may comprise: a logic cell that includes a PMOSFET area and an NMOSFET area on a substrate, the PMOSFET and NMOSFET areas being spaced apart from each other in a first direction; a separation structure on at least one side of the logic cell, the separation structure extending in the first direction and separating the logic cell from an adjacent logic cell; a plurality of first connection lines in a first interlayer dielectric layer on the logic cell, the first connection lines extending parallel to each other in a second direction that intersects the first direction; and a plurality of second connection lines in a second interlayer dielectric layer on the first interlayer dielectric layer, the second connection lines extending parallel to each other in the first direction. The first connection lines may include: a first lower power line that extends along a first cell boundary of the logic cell; and a second lower power line that extends along a second cell boundary of the logic cell. The first cell boundary may be opposite in the first direction to the second cell boundary. The second connection lines may include a first upper power line that vertically overlaps the separation structure. The first upper power line may be electrically connected to at least one of the first lower power line and the second lower power line.

According to some example embodiments of the present inventive concepts, a semiconductor device may comprise: a logic cell on a substrate, the logic cell including a first active region and a second active region that are spaced apart from each other in a first direction; a first active pattern and a second active pattern on the first active region and the second active region, respectively, the first and second active patterns each extending in a second direction that intersects the first direction; a device isolation layer that covers lower sidewalls of the first active pattern and lower sidewalls of the second active pattern, an upper portion of each of the first and second active patterns vertically protruding upwards from the device isolation layer; a first source/drain pattern and a second source/drain pattern on the upper portion of the first active pattern and the upper portion of the second active pattern, respectively; a plurality of gate electrodes that extend in the first direction and run across the first and second active patterns; a plurality of first connection lines in a first interlayer dielectric layer on the gate electrodes; and a plurality of second connection lines in a second interlayer dielectric layer on the first interlayer dielectric layer, the second connection lines extending parallel to each other in the first direction. The logic cell may have a first cell boundary and a second cell boundary that extend in the second direction. The first and second cell boundaries may be opposite to each other in the first direction. The first connection lines may include: a first lower power line that extends along the first cell boundary; and a second lower power line that extends along the second cell boundary. The second connection lines may include: a first upper power line that vertically overlaps a first gate electrode of the gate electrodes; and an upper line that is offset in the second direction from each of the gate electrodes, when viewed in plan view. The first upper power line may be electrically connected to at least one of the first lower power line and the second lower power line. The upper line may extend from the first active region to the second active region. The upper line may not extend outward beyond the first cell boundary or the second cell boundary.

BRIEF DESCRIPTION OF THE DRAWINGS

FIGS. 12A to 12D, 13A, 13B, and 14 illustrate plan views showing a semiconductor device according to some example embodiments of the present inventive concepts.

DETAILED DESCRIPTION OF EMBODIMENTS

Figure 1:
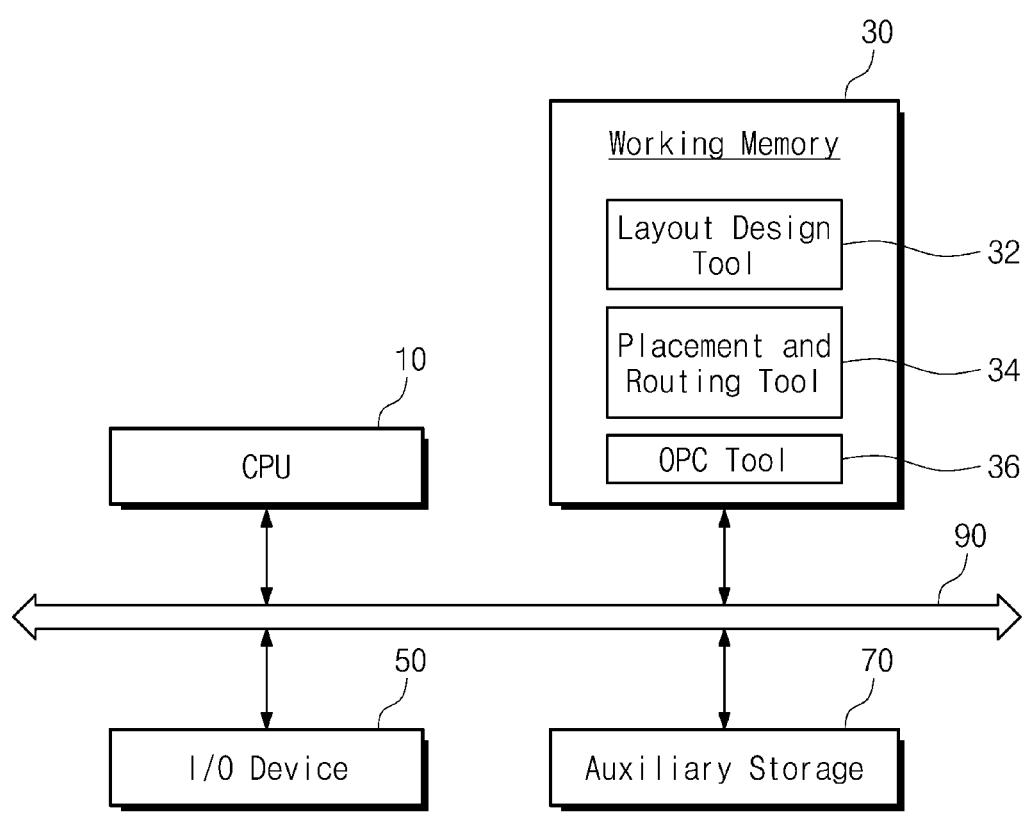
FIG. 1 illustrates a block diagram showing a computer system for semiconductor design, according to some example embodiments of the present inventive concepts.

FIG. 1 illustrates a block diagram showing a computer system for semiconductor design, according to some example embodiments of the present inventive concepts. Referring to FIG. 1, a computer system may include a central processing unit (CPU) 10, a working memory 30, an input/output (I/O) device 50, and an auxiliary storage 70. The computer system may be provided as a dedicated device for designing a layout according to the present inventive concepts. The computer system may be configured to drive various programs for design and verification simulation.

The CPU 10 may allow the computer system to execute software (e.g., application programs, operating system, and device drivers). The CPU 10 may process an operating system loaded in the working memory 30. The CPU 10 may execute various application programs driven based on the operating system. For example, the CPU 10 may process a layout design tool 32, a placement and routing tool 34, and/or an optical proximity correction (OPC) tool 36 that are loaded in the working memory 30.

The operating system or application programs may be loaded in the working memory 30. When the computer system is booted up, based on booting sequence, an operating system image (not shown) stored in the auxiliary storage 70 may be loaded to the working memory 30. Overall input/output operations of the computer system may be supported by the operating system. Likewise, the working memory 30 may be loaded with the application programs that are selected by a user or provided for a basic service.

The layout design tool 32 for layout design may be loaded from the auxiliary storage 70 to the working memory 30. The working memory 30 may be loaded from the auxiliary storage 70 with the placement and routing tool 34 that places designed standard cells and routes the placed standard cells. The working memory 30 may be loaded from the auxiliary storage 70 with the OPC tool 36 that performs an optical proximity correction (OPC) on designed layout data.

The layout design tool 32 may include a bias function by which specific layout patterns are changed in shapes and positions defined by a design rule. In addition, the layout design tool 32 may perform a design rule check (DRC) under the changed bias data condition. The working memory 30 may be either a volatile memory such as static random access memory (SRAM) or dynamic random access memory (DRAM) or a nonvolatile memory such as phase change random access memory (PRAM), magnetic random access memory (MRAM), resistance random access memory (ReRAM), ferroelectric random access memory (FRAM), or NOR Flash memory. The layout design tool 32 and the placement and routing tool 34 may be in the form of software code, e.g., as part of an application program.

The I/O device 50 may control user input/output operations of user interfaces. For example, the I/O device 50 may include a keyboard or a monitor, allowing a designer to input relevant information. The user may use the I/O device 50 to receive information about a semiconductor region or data paths requiring adjusted operating characteristics. The I/O device 50 may display a progress status or a process result of the OPC tool 36.

The auxiliary storage 70 may serve as a storage medium for the computer system. The auxiliary storage 70 may store the application programs, the operating system image, and various data. The auxiliary storage 70 may be provided in the form of one of memory cards (e.g., MMC, eMMC, SD, and Micro SD) and a hard disk drive (HDD). The auxiliary storage 70 may include a NAND Flash memory having large memory capacity. Alternatively, the auxiliary storage 70 may include a NOR Flash memory or a next-generation volatile memory such as PRAM, MRAM, ReRAM, and FRAM.

A system interconnector 90 may be provided to serve as a system bus for providing a network in the computer system. The CPU 10, the working memory 30, the I/O device 50, and the auxiliary storage 70 may be electrically connected through the system interconnector 90 and may exchange data with each other. The system interconnector 90 is not limited to the above description, and may further include intermediary means for efficient management.

Figure 2:
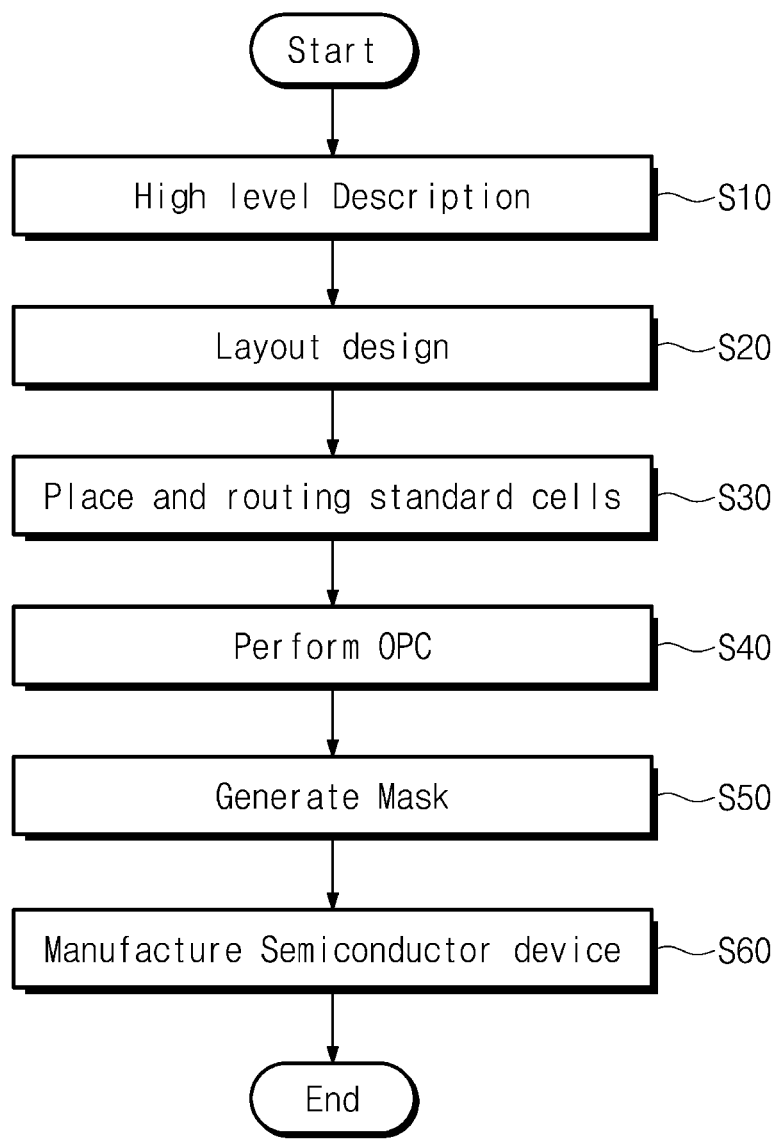
FIG. 2 illustrates a flow chart showing a method of designing and fabricating a semiconductor device, according to some example embodiments of the present inventive concepts.

FIG. 2 illustrates a flow chart showing a method of designing and fabricating a semiconductor device, according to some example embodiments of the present inventive concepts.

Referring to FIG. 2, a high-level design of a semiconductor integrated circuit may be performed using the computer system discussed with reference to FIG. 1 (S10). The high-level design may mean that an integrated circuit corresponding to a design target is described with a high-level language of a hardware description language. For example, the high-level language such as C language may be used in the high-level design. A register transfer level (RTL) coding or simulation may be used to express in detail circuits designed by the high-level design. In addition, codes created by the RTL coding may be converted into a netlist, which netlist may be synthesized to describe an entire semiconductor device. The synthesized schematic circuit may be verified by a simulation tool, and an adjustment process may be performed based on the verified result.

A layout design may be performed to implement on a silicon substrate a semiconductor integrated circuit that is logically completed (S20). For example, the layout design may be performed based on the schematic circuit synthesized in the high-level design or the netlist corresponding to the schematic circuit.

A cell library for the layout design may include information about operation, speed, and power consumption of the standard cell. The cell library for representing a layout of a specific gate-level circuit as a layout may be defined in most tools for designing layouts. The layout may be prepared to define shapes or dimensions of patterns constituting transistors and metal lines that will be actually formed on a silicon substrate. For example, in order to actually form an inverter circuit on a silicon substrate, it may be necessary to appropriately place or describe layout patterns such as PMOS, NMOS, N-WELL, gate electrodes, and metal lines thereon. For this, a search may be first performed to select a suitable one of inverters predefined in the cell library.

Various standard cells stored in the cell library may be placed and routed (S30). For example, the standard cells may be placed two-dimensionally. High-level lines (routing patterns) may be provided on the placed standard cells. The standard cells may be well-designedly connected to each other through the routing step. The placement and routing of the standard cells may be automatically performed by the placement and routing tool 34.

After the routing step, a verification step may be performed on the layout to check whether any portion of the schematic circuit violates the given design rule. The verification step may include a design rule check (DRC) for verifying whether the layout meets the given design rule, an electrical rule check (ERC) for verifying whether there is an issue of an electrical disconnection in the layout, and a layout vs. schematic (LVS) for verifying whether the layout agrees with the gate-level netlist.

An optical proximity correction (OPC) step may be performed (S40). A photolithography process may be employed to achieve on a silicon substrate the layout patterns obtained by the layout design. The optical proximity correction process may be a technique for correcting an unintended optical effect that occurs in the photolithography process. For example, the optical proximity correction process may correct an undesirable phenomenon such as refraction, or may process side effects caused by characteristics of light in an exposure process using the layout patterns. When the optical proximity correction step is performed, the designed layout patterns may be slightly changed (or biased) in shapes and positions.

A photomask may be generated based on the layout changed by the optical proximity correction (S50). The photomask may generally be manufactured by describing the layout patterns using a chromium layer coated on a glass substrate.

The generated photomask may be used to manufacture a semiconductor device (S60). Various exposure and etching processes may be repeatedly performed in manufacturing the semiconductor device using the photomask. Through these processes discussed above, patterns defined in the layout design may be sequentially formed on a silicon substrate.

Figure 3:
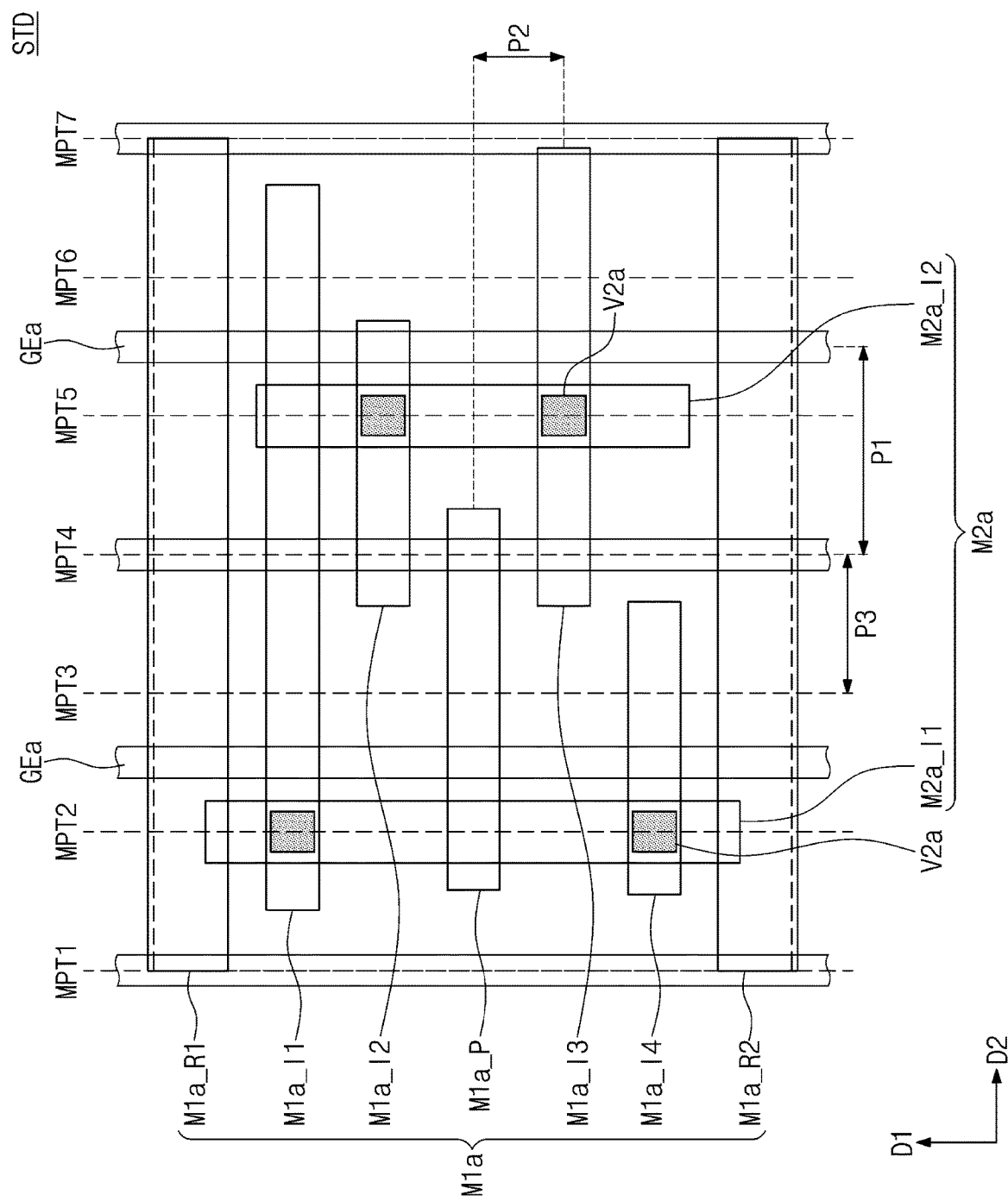
FIGS. 3 and 4 illustrate layouts showing a standard cell designed by a layout design step of FIG. 2.
Figure 4:
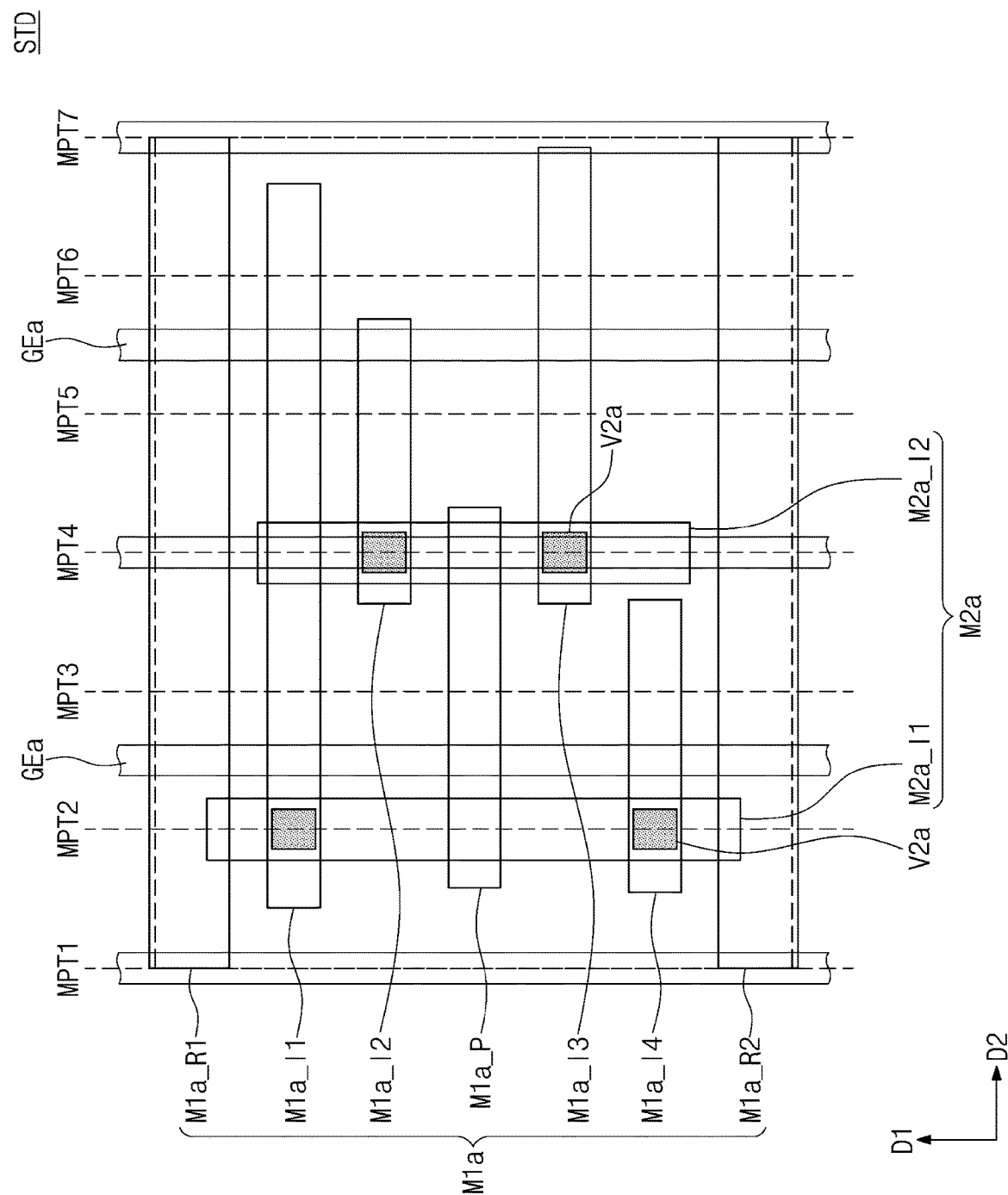

FIGS. 3 and 4 illustrate layouts showing a standard cell designed by the layout design step S20 of FIG. 2. FIGS. 3 and 4 each show, as an example, a layout of a standard cell STD for one logic circuit. The same logic circuit may be included in the standard cell STD shown in FIG. 3 and the standard cell STD shown in FIG. 4. The standard cell STD of FIG. 3 and the standard cell STD of FIG. 4 may each be configured such that one or more of second line patterns M2$a$ may be different in position and shape.

The following will first describe the designed standard cell STD with reference to FIG. 3. The standard cell STD may include gate patterns GE$a$, first line patterns M1$a$, second line patterns M2$a$, and via patterns V2$a$. In addition, the standard cell STD may further include other layout patterns (e.g., active regions and active contact patterns). For brevity of drawings, the other layout patterns (e.g., active regions and active contact patterns) are omitted in the standard cell STD shown in FIG. 3.

The gate patterns GE$a$ may extend (e.g., extend lengthwise) in a first direction D1 and may be arranged along a second direction D2 intersecting (e.g., orthogonal to) the first direction D1. The gate patterns GE$a$ may be arranged at a first pitch P1. The term "pitch" may be a distance between a center of a first pattern and a center of a second pattern adjacent to the first pattern. The gate patterns GE$a$ may define gate electrodes.

The first line patterns M1$a$ may be located at a higher level (e.g., higher vertical level) than that of the gate patterns GE$a$, and therefore, may be a greater distance than the gate patterns GE$a$ from a substrate on which the first line patterns M1 and gate patterns GE$a$ are formed. The first line patterns M1$a$ may define a first metal layer (first connection lines). For example, the first line patterns M1$a$ may include a first lower power pattern M1$a$_R1, a second lower power pattern M1$a$_R2, first to fourth lower line patterns M1$a$_I1 to M1$a$_I4, and a pin pattern M1$a$_P.

The first lower power pattern M1$a$_R1, the second lower power pattern M1$a$_R2, the first to fourth lower line patterns M1$a$_I1 to M1$a$_I4, and the pin pattern M1$a$_P may be patterns disposed at the same layer (e.g., same vertical layer at the same vertical level). The first lower power pattern M1$a$_R1, the second lower power pattern M1$a$_R2, the first to fourth lower line patterns M1$a$_I1 to M1$a$_I4, and the pin pattern M1$l$_P may extend parallel to each other along the second direction D2.

The first lower power pattern M1$a$_R1 and the second lower power pattern M1$a$_R2 may extend to run across the standard cell STD. The first to fourth lower line patterns M1$a$I1 to M1$a$I4 and the pin pattern M1$a$_P may be disposed between the first lower power pattern M1$a$_R1 and the second lower power pattern M1$a$_R2 in the first direction D1. The pin pattern M1$a$_P may be disposed between the second and third lower line patterns M1$a$_I2 and M1$a$_I3 in the first direction D1. It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

The first to fourth lower line patterns M1$a$_I1 to M1$a$_I4 and the pin pattern M1$a$_P may be arranged along the first direction D1. The first to fourth lower line patterns M1$a$_I1 to M1$a$_I4 and the pin pattern M1$a$_P may be arranged at a second pitch P2. Each of the first to fourth lower line patterns M1$a$_I1 to M1$a$_I4 and the pin pattern M1$a$_P may be separated by adjacent ones of the first to fourth lower line patterns M1$a$_I1 to M1$a$_I4 and the pin pattern M1$a$_P by the second pitch P2. The second pitch P2 may be less than the first pitch P1.

The pin pattern M1$a$_P may define a pin connection line in the first metal layer. For example, the pin connection line may be a connection line that receives signals from outside the standard cell STD. For another example, the pin connection line may be a connection line through which signals are externally output from the standard cell STD.

The second line patterns M2a may be located at a higher level than that of the first line patterns M1a. The second line patterns M2a may define a second metal layer (second connection lines). For a layout of the standard cell STD prior to routing, the second line pattern M2a may include first and second upper line pattern M2a_I1 and M2a_I2. The first and second upper line patterns M2a_I1 and M2a_I2 may extend parallel to each other and may extend along the first direction D1. The first and second upper line patterns M2a_I1 and M2a_I2 may be parallel to the gate patterns GEa.

First to seventh line tracks MPT1 to MPT7 may be imaginary lines used for placing the second line pattern M2a in the standard cell STD. The first to seventh line tracks MPT1 to MPT7 may extend in the first direction D1. For example, the first upper line pattern M2a_I1 may be disposed on the second line track MPT2. A center of the first upper line pattern M2a_I1 may be aligned with the second line track MPT2. The second upper line pattern M2a_I2 may be disposed on the fifth line track MPT5. A center of the second upper line pattern M2a_I2 may be aligned with the fifth line track MPT5.

The first to seventh line tracks MPT1 to MPT7 may be arranged along the second direction D2 at a third pitch P3. The third pitch P3 may be less than the first pitch P1. The third pitch P3 may be greater than the second pitch P2.

At least one of the first to seventh line tracks MPT1 to MPT7 may be aligned with a center of a gate pattern GEa. For example, the center of a gate pattern GEa may be aligned with the fourth line track MPT4.

The via patterns V2a may be disposed on regions where the first line pattern M1a overlaps the second line pattern M2a from a plan view. For example, one of the via patterns V2a may be disposed vertically between the first lower line pattern M1a_I1 and the first upper line pattern M2a_I1 where the first lower line pattern M1a_I1 and the first upper line pattern M2a_I1 cross. Another of the via patterns V2a may be disposed vertically between the fourth lower line pattern M1a_I4 and the first upper line pattern M2a_I1 where the fourth lower line pattern M1a_I4 and the first upper line pattern M2a_I1 cross.

The via pattern V2a may define a via that vertically connects the first connection line (e.g., the first line pattern M1a) to the second connection line (e.g., the second line pattern M2a). For example, the via patterns V2a and the second line patterns M2a may define the second metal layer.

For the standard cell STD in the present embodiment of FIG. 3, neither the first upper line pattern M2a_I1 nor the second upper line pattern M2a_I2 overlap the gate patterns GEa. In such cases, each of the first and second upper line patterns M2a_I1 and M2a_I2 may be offset in the second direction D2 from the gate pattern GEa adjacent thereto from a plan view. For example, no upper line pattern M2a_I may be disposed on the fourth line track MPT4 that runs across the center of the gate pattern GEa.

The following will describe the designed standard cell STD with reference to FIG. 4. In the embodiment that follows, omission will be made to avoid repetition of the standard cell STD discussed above with reference to FIG. 3, and differences will be explained in detail. The second upper line pattern M2a_I2 may be disposed on the fourth line track MPT4. The second upper line pattern M2a_I2 may therefore overlap the gate pattern GEa from a plan view.

Figure 5:
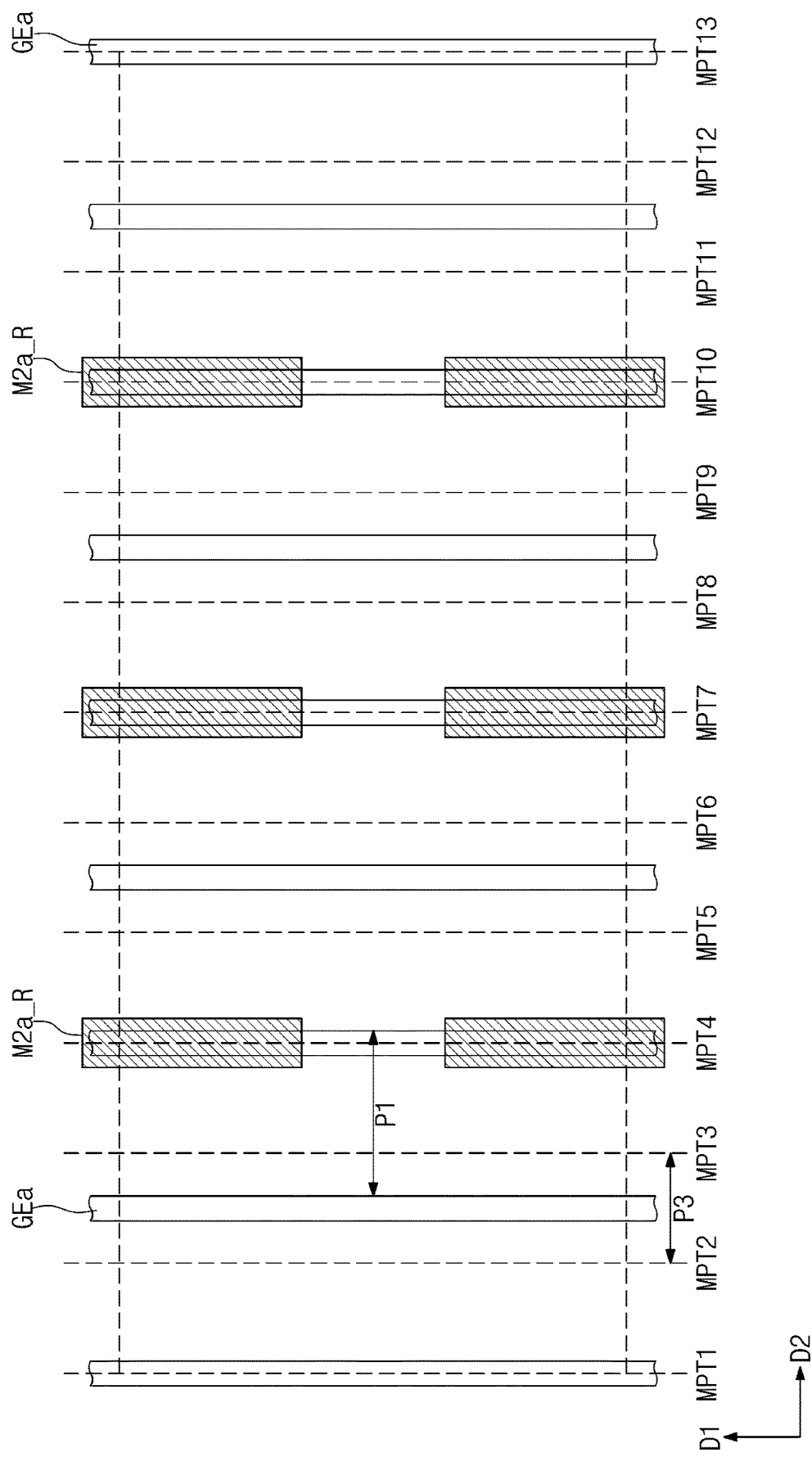
FIGS. 5 to 8 illustrate layout plan views showing in detail a step of placing and routing standard cells in the method of FIG. 2.

FIGS. 5 to 8 illustrate layout plan views showing in detail the step S30 of placing and routing standard cells in the method of FIG. 2. Referring to FIG. 5, the gate patterns GEa may be arranged along the second direction D2, while extending in the first direction D1. The gate patterns GEa may be arranged at a first pitch P1 with respect to each other.

First to thirteenth line tracks MPT1 to MPT13 may be defined. The first to thirteenth line tracks MPT1 to MPT13 may extend parallel to each other in the first direction D1. The first to thirteenth line tracks MPT1 to MPT13 may be arranged along the second direction D2 at a third pitch P3 with respect to each other.

One or more of the first to thirteenth line tracks MPT1 to MPT13 may overlap the gate patterns GEa. For example, each of the first, fourth, seventh, tenth, and thirteenth line tracks MPT1, MPT4, MPT7, MPT10, and MPT13 run across a center of the gate pattern GEa.

A pair of upper power patterns M2a_R may be disposed on at least one of the first to thirteenth line tracks MPT1 to MPT13. For example, a pair of upper power patterns M2a_R may be disposed on the fourth line track MPT4. A pair of upper power patterns M2a_R may be disposed on the seventh line track MPT7. A pair of upper power patterns M2a_R may be disposed on the tenth line track MPT10.

Each pattern of a pair of upper power patterns M2a_R may have a bar shape that extends in the first direction D1. A pair of upper power patterns M2a_R may overlap the gate pattern GEa from a plan view (e.g., may overlap a single gate pattern GEa. For example, a pair of upper power patterns M2a_R may be provided on the gate pattern GEa. A pair of upper power patterns M2a_R may be arranged in the first direction D1 along the gate pattern GEa. A pair of upper power patterns M2a_R may be aligned with each other along a line extending in the first direction D1 along the gate pattern GEa. For example, for two upper power patterns M2a_R aligned along a line extending in the first direction D1 along a gate pattern GEa, opposite edges (e.g., side surfaces) of a first upper power pattern M2a_R opposite each other in the second direction D2 may be aligned with respective opposite edges (e.g., side surfaces) of a second upper power pattern M2a_R opposite each other in the second direction D2.

Figure 6:
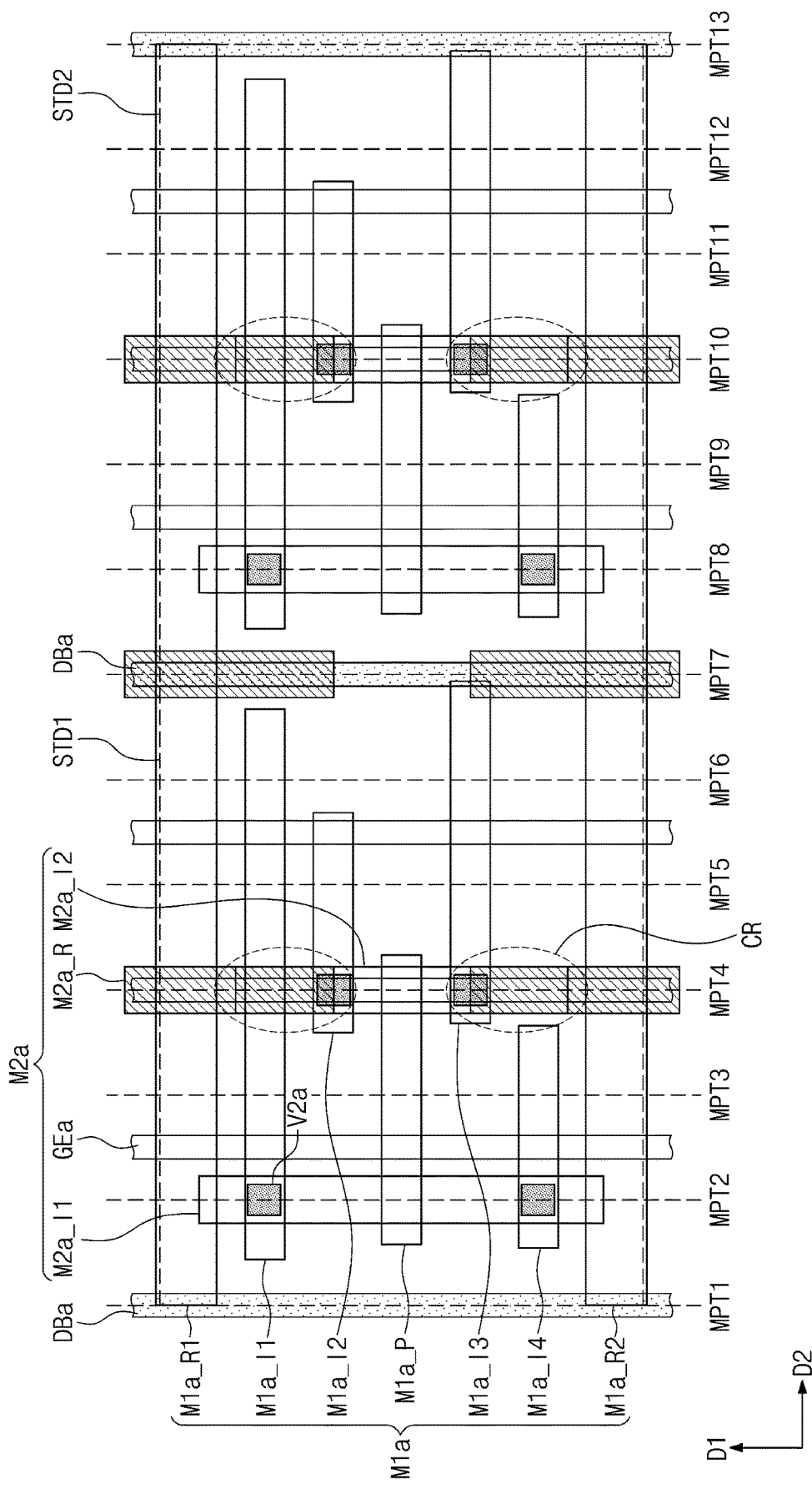

Referring to FIG. 6, first and second standard cells STD1 and STD2 may be disposed adjacent to each other in the second direction D2. For example, each of the first and second standard cells STD1 and STD2 may be the standard cell STD discussed above in FIG. 4.

A pair of separation patterns DBa may be disposed on opposite sides of each of the first and second standard cells STD1 and STD2 in the second direction D2 (note, only one pair of separation patterns DBa on one side of each standard cell STD1 and STD2 is shown in FIG. 6). For example, the separation patterns DBa may substitute for the gate patterns GEa on opposite sides of the first standard cell STD1 in the second direction D2. The separation patterns DBa may substitute for the gate patterns GEa on opposite sides of the second standard cell STD2. The separation patterns DBa may be interposed between the first and second standard cells STD1 and STD2.

When the first standard cell STD1 is disposed as shown in FIG. 6, the second upper line pattern M2a_I2 of the first standard cell STD1 may be located on the fourth line track MPT4. However, referring to FIG. 5, a pair of upper line patterns M2a_R may already be disposed on the fourth line track MPT4. Therefore, a collision region CR may be created where the second upper line pattern M2a_I2 overlaps a pair of upper power patterns M2a_R. Because the second upper power pattern M2a_I2 occupies the same position as that of a pair of upper power patterns M2a_R that constitute the second line pattern M2a, the second upper power pattern M2a_I2 may collide with the pair of upper power patterns M2a_R.

In order to address the situation above, it may be determined that the first and second standard cells STD1 and STD2 be shifted in the second direction D2. Eventually, a region (empty space) may be created on which is disposed neither the first standard cell STD1 nor the second standard cell STD2, which may result in a reduction in integration of a device.

Figure 7:
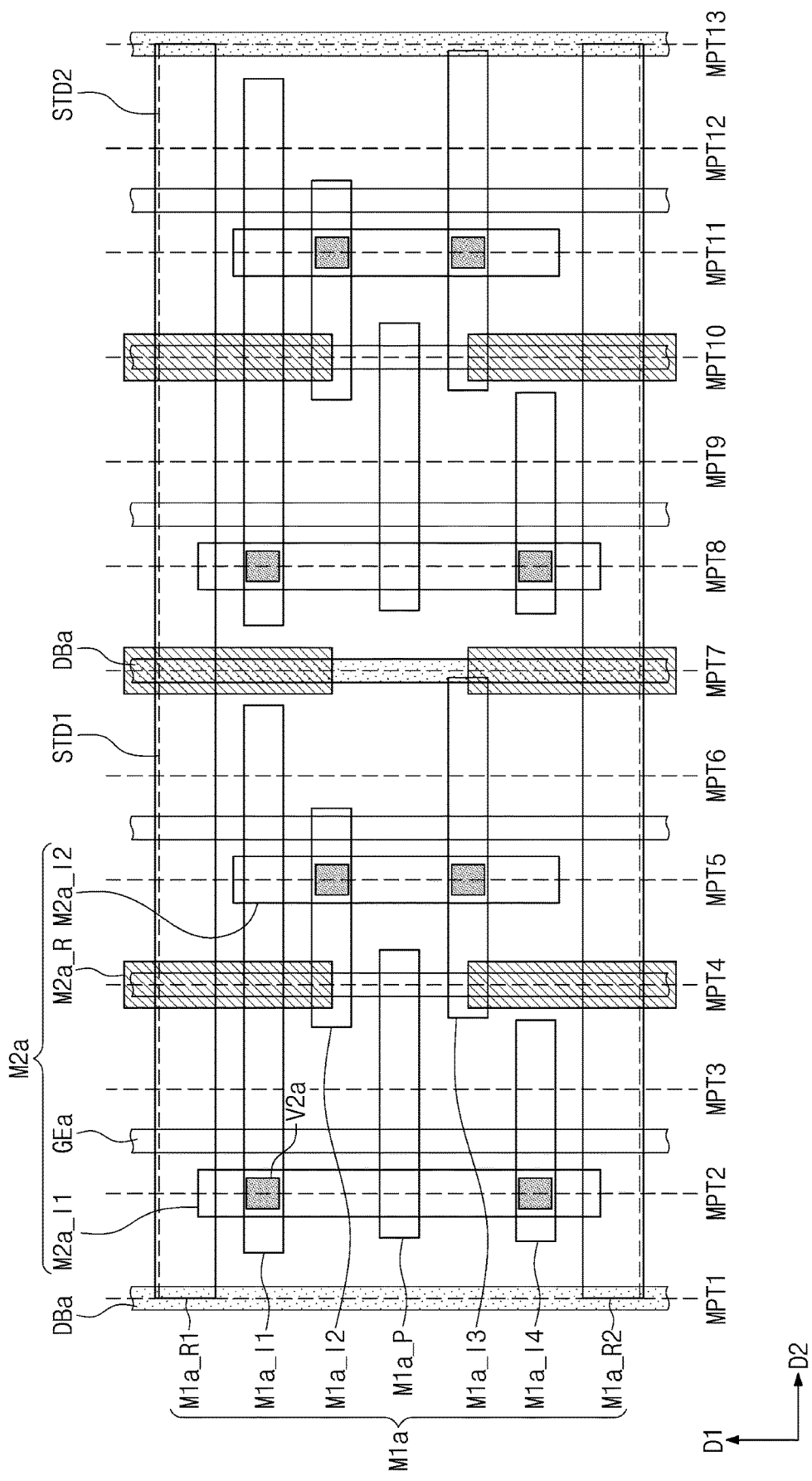

Referring to FIG. 7, first and second standard cells STD1 and STD2 may be disposed in the second direction D2 on a resultant structure of FIG. 5. Each of the first and second standard cells STD1 and STD2 according to the present embodiment may be the standard cell STD discussed above in FIG. 3. As discussed above, the standard cell STD in FIG. 3 may be configured such that neither the first upper line pattern M2a_I1 nor the second upper line pattern M2a_I2 overlaps the gate patterns GEa.

For example, when the first standard cell STD1 is disposed as shown in FIG. 7, the second upper line pattern M2a_I2 of the first standard cell STD1 may be located on the fifth line track MPT5. Because the second upper line pattern M2a_I2 is disposed on the fifth line track MPT5, the second upper line pattern M2a_I2 does not collide with a pair of upper power patterns M2a_R disposed on the fourth line track MPT4.

According to the present embodiment, because no collision is generated between the second upper line pattern M2a_I2 and the pair of upper power patterns M2a_R, it may not be required that the first standard cell STD1 be shifted in the second direction D2. For the same reason as the first standard cell STD1, it may not be required to shift the second standard cell STD2. According to the present embodiment, differently from that shown in FIG. 6, no empty space may be created, and a semiconductor device may then increase in integration.

Figure 8:
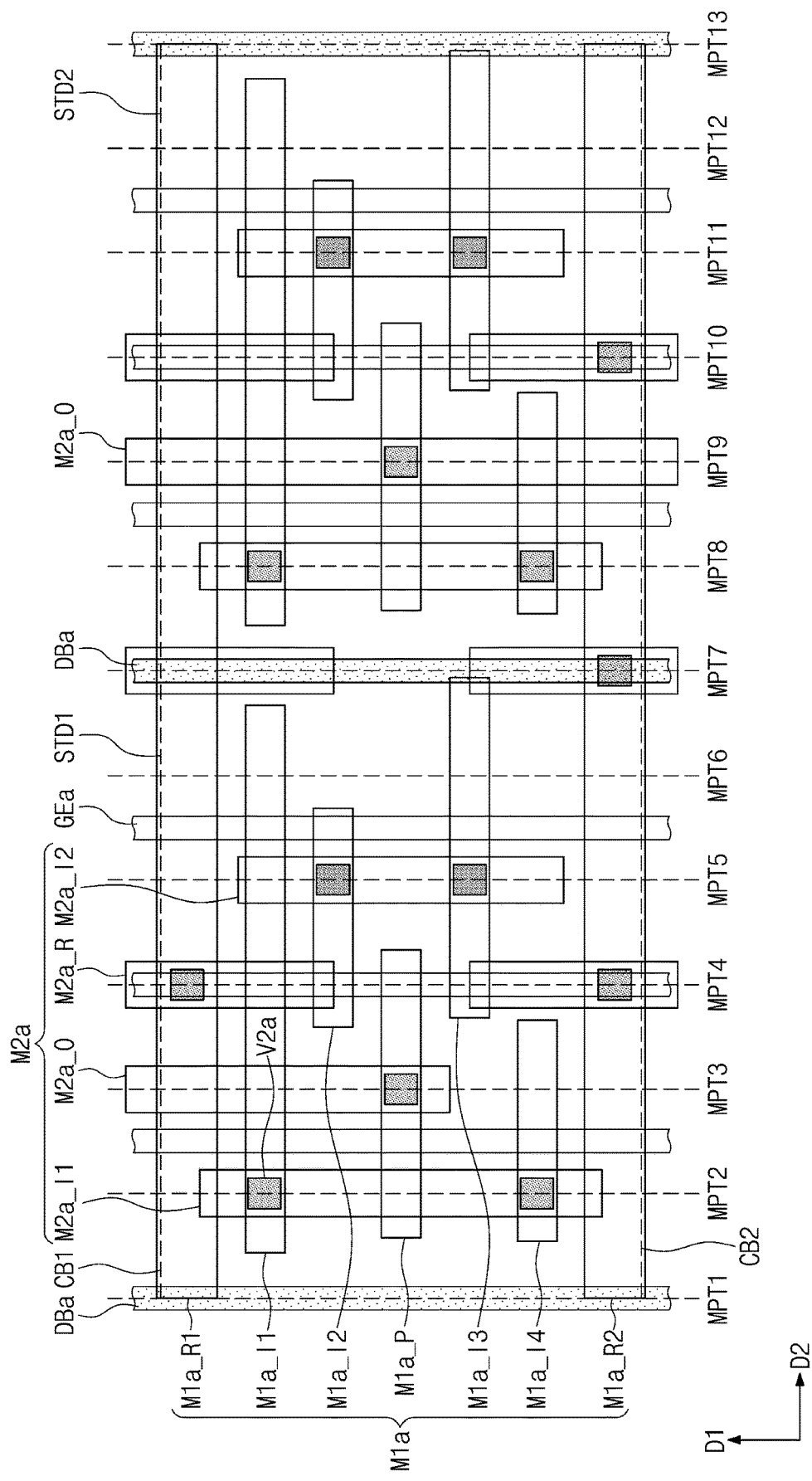

Referring to FIG. 8, a routing step may be performed to route the first and second standard cells STD1 and STD2. The routing of the first and second standard cells STD1 and STD2 may include placing routing patterns M2a_O. The placement of the routing patterns M2a_O may connect standard cells to each other in accordance with a designed circuit.

A first cell boundary CB1 may be defined to extend in the second direction D2 on each of the first and second standard cells STD1 and STD2. On each of the first and second standard cells STD1 and STD2, a second cell boundary CB2 may be defined to stand opposite to the first cell boundary CB1. The first lower power pattern M1a_R1 may be disposed on the first cell boundary CB1. The second lower power pattern M1a_R2 may be disposed on the second cell boundary CB2. On each of the first and second standard cells STD1 and STD, the routing patterns M2a_O may extend outward in the first direction D1 beyond the first cell boundary CB1 or the second cell boundary CB2. The routing patterns M2a_O may be connected to the pin pattern M1a_P.

The routing patterns M2a_O, the first and second upper line patterns M2a_I1 and M2a_I2, and the upper power patterns M2a_R may constitute the second line patterns M2a. The second line patterns M2a may define the second metal layer (second connection lines).

The via pattern V2a may be disposed between the routing pattern M2a_O and the pin pattern M1a_P. The via pattern V2a may define a connection between the routing pattern M2a_O and the pin pattern M1a_P. The via pattern V2a may be disposed between the upper power pattern M2a_R and the lower power pattern M1a_R. The via pattern V2a may define a connection between the upper power pattern M2a_R and the lower power pattern M1a_R.

After completion of replacement and routing of standard cells according to FIG. 8, an optical proximity correction may be performed on the designed layout, and a photomask may be generated. The generated photomask may be used in a semiconductor process, and therefore a semiconductor device may be manufactured (see FIG. 2).

Figure 9:
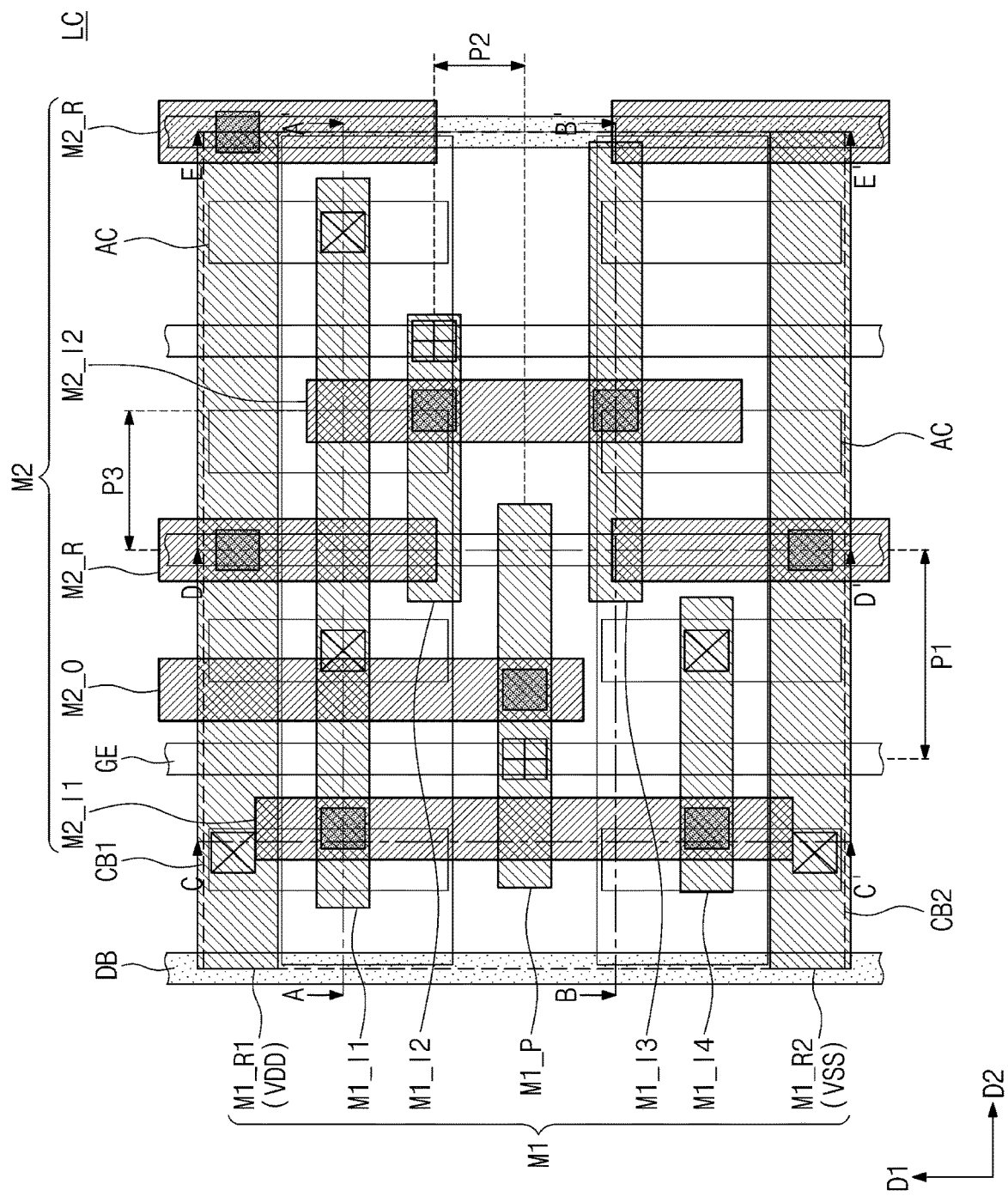
FIG. 9 illustrates a plan view showing a semiconductor device according to some example embodiments of the present inventive concepts.

FIG. 9 illustrates a plan view showing a semiconductor device according to some example embodiments of the present inventive concepts. FIGS. 10A, 10B, 10C, and 10D illustrate cross-sectional views respectively taken along lines A-A', B-B', C-C', and D-D' of FIG. 9. FIGS. 9 and 10A to 10C exemplarily show a semiconductor device actually achieved on a substrate when the first standard cell STD1 of FIG. 8 is used.

Referring to FIGS. 9, 10A to 10D, a logic cell LC may be provided on a substrate 100. The logic cell LC may be provided thereon with logic transistors included in a logic circuit.

The substrate 100 may include a first active region PR and a second active region NR. In some embodiments of the present inventive concepts, the first active region PR is a PMOSFET area, and the second active region NR is an NMOSFET area. The substrate 100 may be a compound semiconductor substrate or a semiconductor substrate including silicon, germanium, or silicon-germanium. For example, the substrate 100 may be a silicon substrate.

The first active region PR and the second active region NR may be defined by a second trench TR2 formed on an upper portion of the substrate 100. The second trench TR2 may be positioned between the first active region PR and the second active region NR. The first active region PR and the second active region NR may be spaced apart from each other in a first direction D1 across the second trench TR2. Each of the first and second active regions PR and NR may extend in a second direction D2 intersecting the first direction D1.

First active patterns AP1 and second active patterns AP2 may be respectively provided on the first active region PR and the second active region NR. The first and second active patterns AP1 and AP2 may extend parallel to each other in the second direction D2. The first and second active patterns AP1 and AP2 may protrude from a surface of a substrate, and may be vertically protruding portions of the substrate 100 or in some cases epitaxially grown from the substrate 100. A first trench TR1 may be defined between adjacent first active patterns AP1 and between adjacent second active patterns AP2. The first trench TR1 may be shallower than the second trench TR2.

A device isolation layer ST may fill the first and second trenches TR1 and TR2. The device isolation layer ST may include, or may be, a silicon oxide layer. The first and second active patterns AP1 and AP2 may have their upper portions that protrude vertically upward from the device isolation layer ST (see FIG. 10D). Each of the upper portions of the first and second active patterns AP1 and AP2 may have a fin shape. The device isolation layer ST may not cover the upper portions of the first and second active patterns AP1 and AP2. The device isolation layer ST may cover lower sidewalls of the first and second active patterns AP1 and AP2.

First source/drain patterns SD1 may be provided on the upper portions of the first active patterns AP1. The first source/drain patterns SD1 may be impurity regions having a first conductivity type (e.g., p-type). A first channel pattern CH1 may be interposed between a pair of first source/drain patterns SD1. Second source/drain patterns SD2 may be provided on the upper portions of the second active patterns AP2. The second source/drain patterns SD2 may be impurity regions having a second conductivity type (e.g., n-type). A second channel pattern CH2 may be interposed between a pair of second source/drain patterns SD2.

The first and second source/drain patterns SD1 and SD2 may be epitaxial patterns formed by a selective epitaxial growth process. For example, the first and second source/drain patterns SD1 and SD2 may have their top surfaces coplanar with those of the first and second channel patterns CH1 and CH2. For another example, the first and second source/drain patterns SD1 and SD2 may have their top surfaces higher than those of the first and second channel patterns CH1 and CH2.

The first source/drain patterns SD1 may include a semiconductor element (e.g., SiGe) whose lattice constant is greater than that of a semiconductor element of the substrate 100. Therefore, the first source/drain patterns SD1 may provide the first channel patterns CH1 with compressive stress. For example, the second source/drain patterns SD2 may include the same semiconductor element (e.g., Si) as that of the substrate 100.

Gate electrodes GE may be provided to extend in the first direction D1, while running across the first and second active patterns AP1 and AP2. The gate electrodes GE may be arranged along the second direction D2 at a first pitch P1. The gate electrodes GE may vertically overlap the first and second channel patterns CH1 and CH2. Each of the gate electrodes GE may surround a top surface and opposite sidewalls of each of the first and second channel patterns CH1 and CH2.

Referring back to FIG. 10D, the gate electrode GE may be provided on a first top surface TS1 of the first channel pattern CH1 and on at least one first sidewall SW1 of the first channel pattern CH1. The gate electrode GE may be provided on a second top surface TS2 of the second channel pattern CH2 and on at least one second sidewall SW2 of the second channel pattern CH2. In this sense, a transistor according to the present embodiment may be a three-dimensional field effect transistor (e.g., FinFET) in which the gate electrode GE three-dimensionally surrounds the first and second channel patterns CH1 and CH2.

Referring back to FIGS. 9 and 10A to 10D, a pair of gate spacers GS may be disposed on opposite sidewalls of each of the gate electrodes GE. The gate spacers GS may extend in the first direction D1 along the gate electrodes GE. The gate spacers GS may have their top surfaces higher than those of the gate electrodes GE. The top surfaces of the gate spacers GS may be coplanar with that of a first interlayer dielectric layer 110 which will be discussed below. The gate spacers GS may include one or more of SiCN, SiCON, and SiN. Alternatively, the gate spacers GS may include a multi-layer including two or more of SiCN, SiCON, and SiN. Terms such as "same," "equal," "planar," or "coplanar," as used herein encompass identicality or near identicality including variations that may occur, for example, due to manufacturing processes. The term "substantially" may be used herein to emphasize this meaning, unless the context or other statements indicate otherwise.

A gate capping pattern GP may be provided on each of the gate electrodes GE. The gate capping pattern GP may extend in the first direction D1 along the gate electrode GE. The gate capping pattern GP may include a material having an etch selectivity with respect to first and second interlayer dielectric layers 110 and 120 which will be discussed below. For example, the gate capping pattern GP may include one or more of SiON, SiCN, SiCON, and SiN.

A gate dielectric pattern GI may be interposed between the gate electrode GE and the first active pattern AP1 and between the gate electrode GE and the second active pattern AP2. The gate dielectric pattern GI may extend along a bottom surface of the gate electrode GE that overlies the gate dielectric pattern GI. For example, a gate dielectric pattern GI may cover the first top surface TS1 and the first sidewall SW1 of the first channel pattern CH1. A gate dielectric pattern GI may cover the second top surface TS2 and the second sidewall SW2 of the second channel pattern CH2. The gate dielectric pattern GI may cover a top surface of the device isolation layer ST below the gate electrode GE (see FIG. 10D).

In some embodiments of the present inventive concepts, the gate dielectric pattern GI may include a high-k dielectric material whose dielectric constant is greater than that of a silicon oxide layer. For example, the high-k dielectric material may include one or more of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

The gate electrode GE may include a first metal pattern and a second metal pattern on the first metal pattern. The first metal pattern may be provided on the gate dielectric pattern GI and adjacent to the first and second channel patterns CH1 and CH2. The first metal pattern may include a work function metal that controls a threshold voltage of a transistor. A thickness and composition of the first metal pattern may be adjusted to achieve a desired threshold voltage.

The first metal pattern may include, or may be, a metal nitride layer. For example, the first metal pattern may include nitrogen (N) and at least one metal which is selected from titanium (Ti), tantalum (Ta), aluminum (Al), tungsten (W), and molybdenum (Mo). The first metal pattern may further include carbon (C). The first metal pattern may include a plurality of work function metal layers that are stacked.

The second metal pattern may include, or may be, metal whose resistance is lower than that of the first metal pattern. For example, the second metal pattern may include one or more of tungsten (W), aluminum (Al), titanium (Ti), and tantalum (Ta).

A first interlayer dielectric layer 110 may be provided on the substrate 100. The first interlayer dielectric layer 110 may cover the gate spacers GS and the first and second source/drain patterns SD1 and SD2. The first interlayer dielectric layer 110 may have a top surface substantially coplanar with those of the gate capping patterns GP and those of the gate spacers GS. The first interlayer dielectric layer 110 may be provided thereon with a second interlayer dielectric layer 120 that covers the gate capping patterns GP. A third interlayer dielectric layer 130 may be provided on the second interlayer dielectric layer 120. A fourth interlayer dielectric layer 140 may be provided on the third interlayer dielectric layer 130. For example, the first to fourth interlayer dielectric layers 110 to 140 may include, or may each be, a silicon oxide layer.

The logic cell LC may be provided on its opposite sides with a pair of separation structures DB that face each other in the second direction D2. Each separation structure DB may extend in the first direction D1 parallel to the gate electrodes GE. Each separation structure DB and its adjacent gate electrode GE may be arranged at a first pitch P1.

Figure 10A:
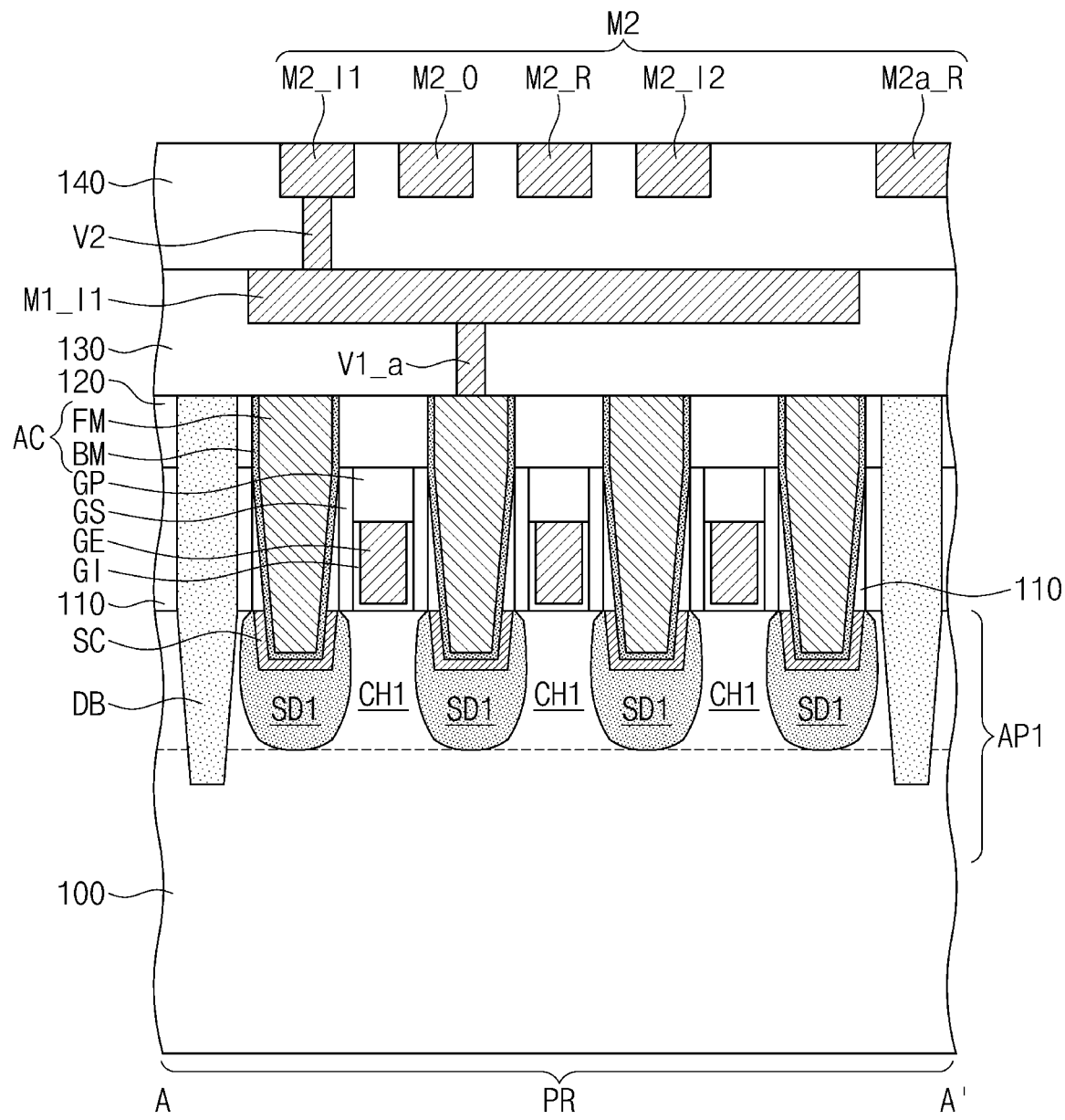
FIGS. 10A, 10B, 10C, 10D, and 10E illustrate cross-sectional views respectively taken along lines A-A', B-B', C-C', D-D', and E-E' of FIG. 9.
Figure 10B:
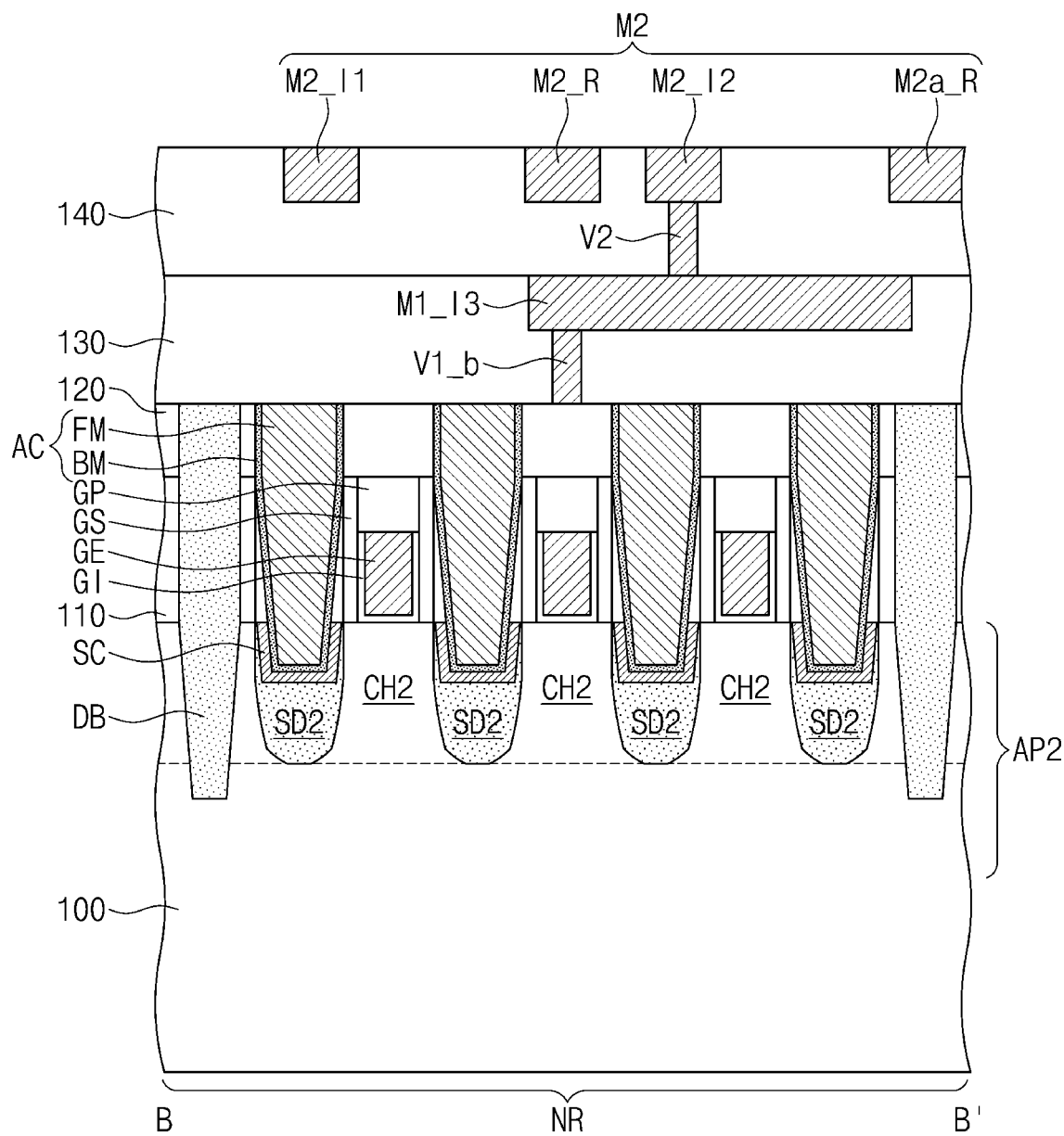
Figure 10C:
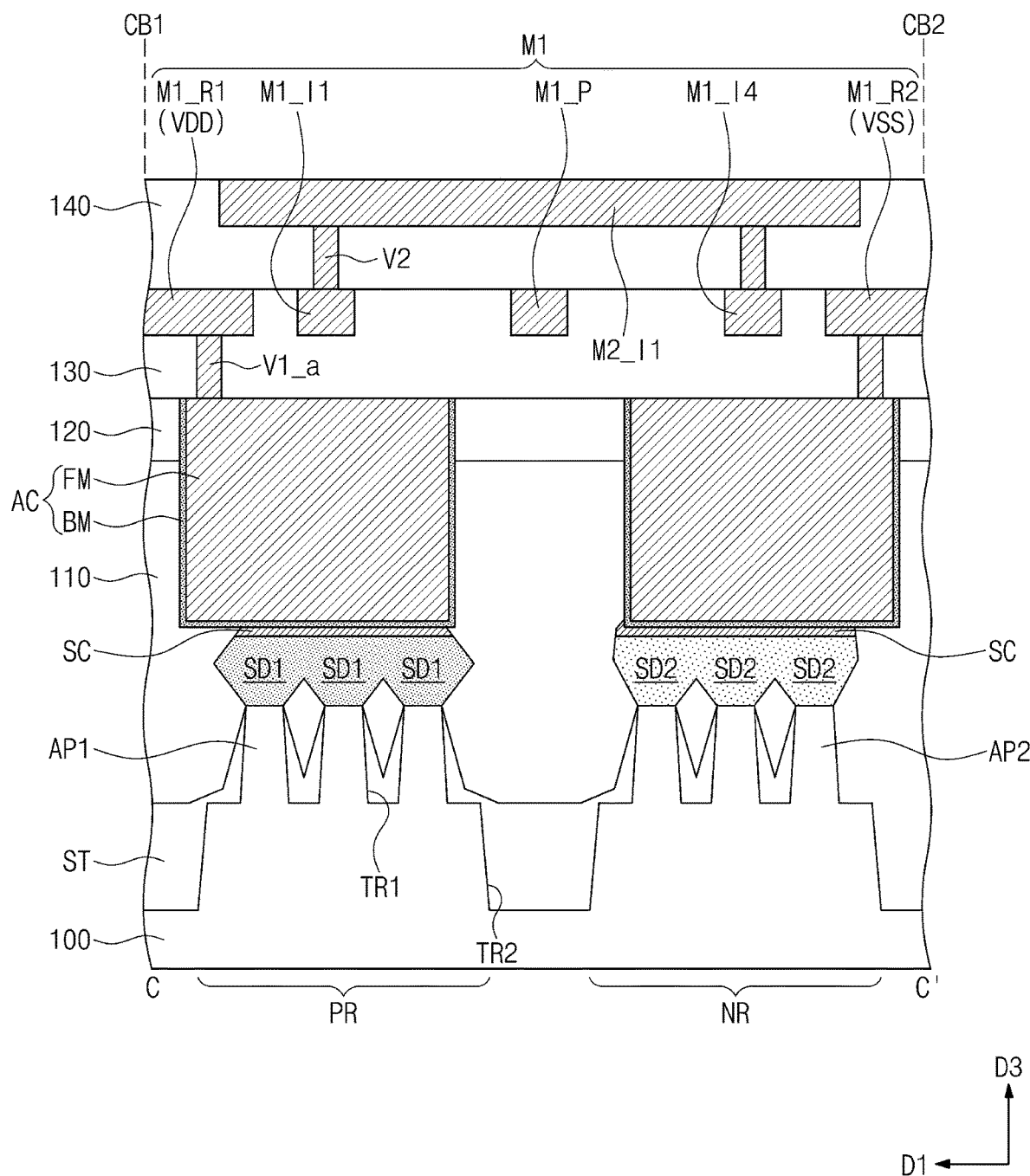
Figure 10D:
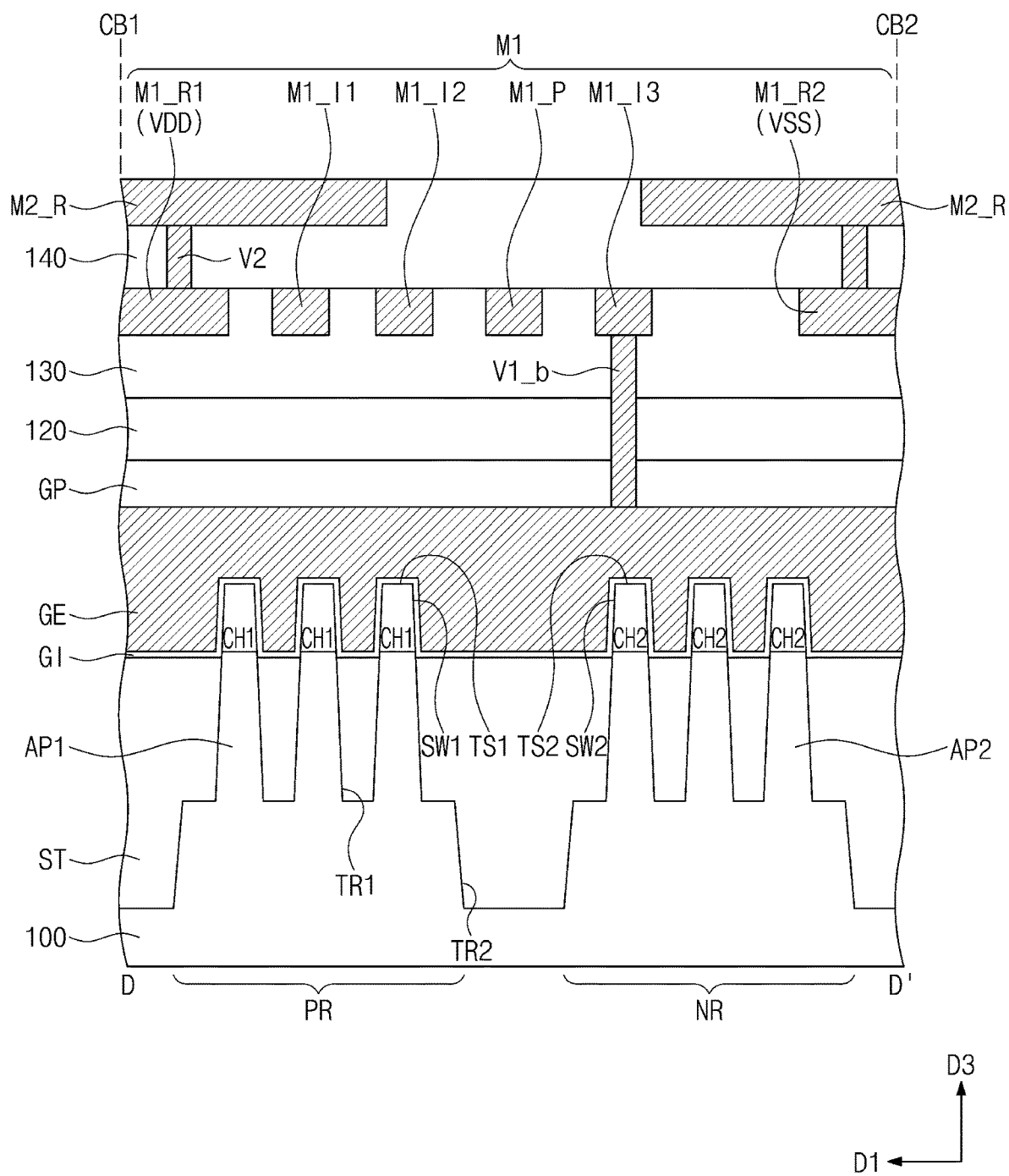
Figure 10E:
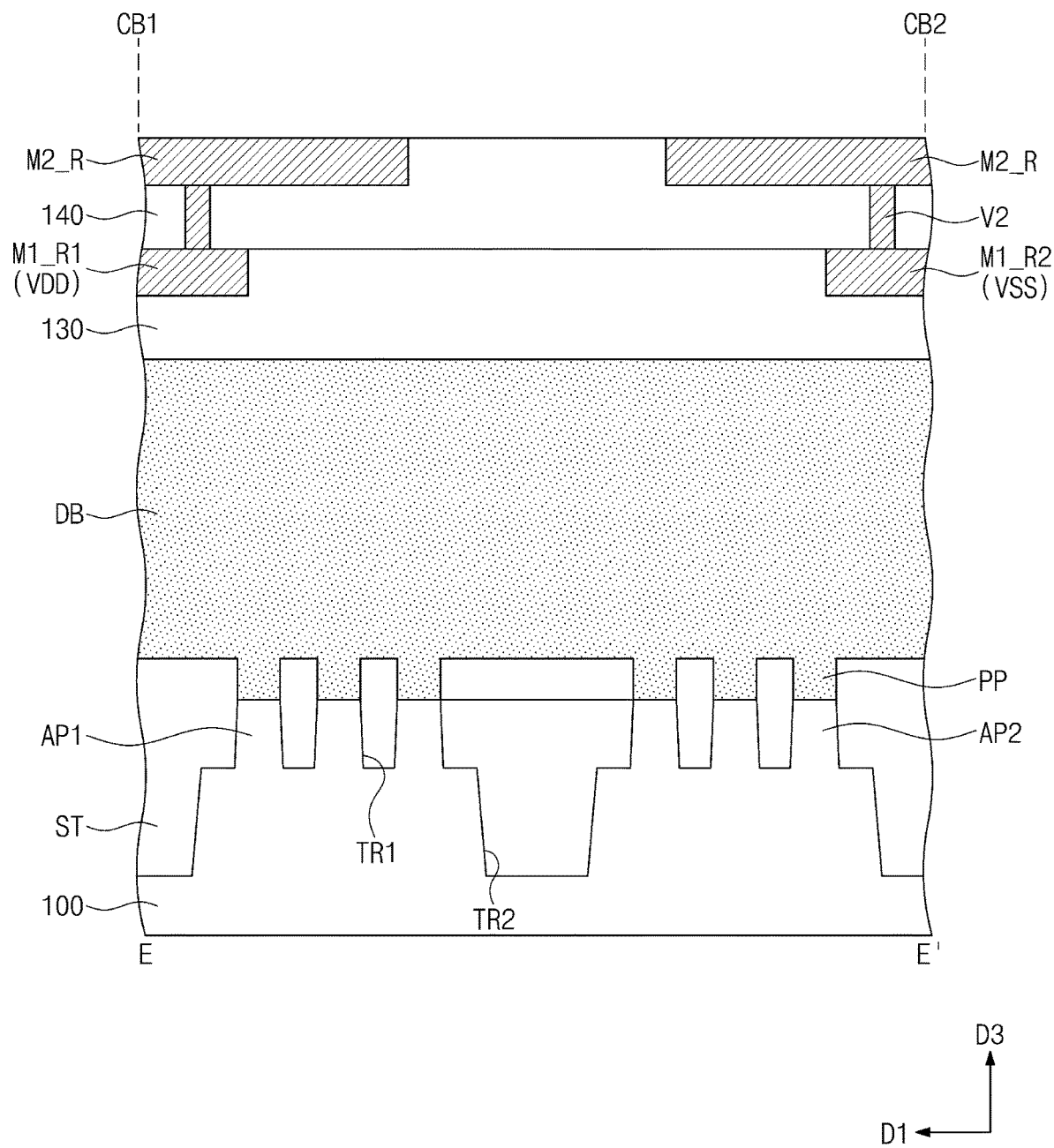

Each separation structure DB may penetrate the first and second interlayer dielectric layers 110 and 120, and may extend into the first and second active patterns AP1 and AP2. The separation structure DB may penetrate each of the upper portions of the first and second active patterns AP1 and AP2. For example, the separation structure DB may include protrusions PP that penetrate the first and second active patterns AP1 and AP2 (see FIG. 10E). The separation structure DB may separate the first and second active regions PR and NR of the logic cell LC from an active region of an adjacent logic cell.

Active contacts AC may be provided to penetrate the first and second interlayer dielectric layers 110 and 120 and to have electrical connection with the first and second source/drain patterns SD1 and SD2. Each of the active contacts AC may be provided between a pair of gate electrodes GE.

The active contact AC may be a self-aligned contact. For example, the gate capping pattern GP and the gate spacer GS may be used to form the active contact AC in a self-aligned manner. The active contact AC may cover, for example, at least a portion of a sidewall of the gate spacer GS. Although not shown, the active contact AC may partially cover a top surface of the gate capping pattern GP.

A silicide pattern SC may be interposed between the active contact AC and the first source/drain pattern SD1 and between the active contact AC and the second source/drain pattern SD2. The active contact AC may be electrically connected through the silicide pattern SC to one of the first and second source/drain patterns SD1 and SD2. The silicide pattern SC may include, or be formed of, metal silicide, for example, one or more of titanium silicide, tantalum silicide, tungsten silicide, nickel silicide, and cobalt silicide.

The active contact AC may include a conductive pattern FM and a barrier pattern BM that surrounds the conductive pattern FM. For example, the conductive pattern FM may include, or may be formed of, one or more of aluminum, copper, tungsten, molybdenum, and cobalt. The barrier pattern BM may cover sidewalls and a bottom surface of the conductive pattern FM. The barrier pattern BM may include a metal layer and a metal nitride layer. The metal layer may include, or may be, one or more of titanium, tantalum, tungsten, nickel, cobalt, and platinum. The metal nitride layer may include, or may be, one or more of a titanium nitride (TiN) layer, a tantalum nitride (TaN) layer, a tungsten nitride (WN) layer, a nickel nitride (NiN) layer, a cobalt nitride (CoN) layer, and a platinum nitride (PtN) layer.

A first metal layer may be provided in the third interlayer dielectric layer 130. The first metal layer may include first connection lines M1, first lower vias V1_a, and second lower vias V1_b. The first and second lower vias V1_a and V1_b may be provided below the first connection lines M1.

The first connection lines M1 may include a first lower power line M1_R1 and a second lower power line M1_R2 that extend in the second direction D2 and run across the logic cell LC. A first cell boundary CB1 may be defined on the logic cell LC, which first cell boundary CB1 extends in the second direction D2. On the logic cell LC, a second cell boundary CB2 may be defined on a location opposite to that on which the first cell boundary CB1 is defined. The first lower power line M1_R1 may be disposed on the first cell boundary CB1. The first lower power line M1_R1 may extend in the second direction D2 along the first cell boundary CB1. The second lower power pattern M1_R2 may be disposed on the second cell boundary CB2. The second lower power line M1_R2 may extend in the second direction D2 along the second cell boundary CB2.

The first connection lines M1 may further include first to fourth lower lines M1_I1 to M1_I4 and a pin line M1_P between the first and second lower power lines M1_R1 and M1_R2. The first to fourth lower lines M1_I1 to M1_I4 and the pin line M1_P may have linear or bar shapes that extend in the second direction D2.

The first to fourth lower lines M1_I1 to M1_I4 and the pin line M1_P may be arranged along the first direction D1 at a second pitch P2. The second pitch P2 may be less than the first pitch P1.

The first lower vias V1_a may be correspondingly interposed between and may electrically connect the first connection lines M1 and the active contacts AC. The second lower vias V1_b may be correspondingly interposed between and may electrically connect the first connection lines M1 and the gate electrodes GE.

For example, the first lower power line M1_R1 may be electrically connected through the first lower via V1_a to the active contact AC of the first active region PR. The second lower power line M1_R2 may be electrically connected through the first lower via V1_a to the active contact AC of the second active region NR. At least one of the first to fourth lower lines M1_I1 to M1_I4 may be electrically connected through the first lower via V1_a to the active contact AC. At least one of the first to fourth lower lines M1_I1 to M1_I4 may be electrically connected through the second lower via V1_b to the gate electrode GE. The pin line M1_P may be electrically connected through the second lower via V1_b to the gate electrode GE.

A first connection line M1 and its underlying first or second lower via V1_a or V1_b may be integrally connected to each other to constitute a single conductive structure (e.g., which may be continuously formed). For example, the first connection line M1 and either the first or second via V1_a or V1_b may be formed together with each other. A dual damascene process may be performed such that the first connection line M1 and either the first or second lower via V1_a or V1_b may be formed into a single conductive structure.

A second metal layer may be provided in the fourth interlayer dielectric layer 140. The second metal layer may include second connection lines M2 and second vias V2. The second vias V2 may be provided below the second connection lines M2. The second vias V2 may be interposed between and may electrically connect the second connection lines M2 and the first connection lines M1. A second connection line M2 and its underlying second via V2 may be connected to each other. For example, the second connection line M2 may be simultaneously formed with its underlying the second via V2, to form a single, continuous conductive structure. A dual damascene process may be performed to simultaneously form the second connection line M2 and the second via V2.

The second connection lines M2 may have linear or bar shapes that extend in the first direction D1. For example, all of the second connection lines M2 may extend parallel to each other in the first direction D1. When viewed in plan, the second connection lines M2 may be parallel to the gate electrodes GE. The second connection lines M2 may be arranged along the second direction D2 at a third pitch P3. The third pitch P3 may be less than the first pitch P1. The third pitch P3 may be greater than the second pitch P2.

The second connection lines M2 may include first and second upper lines M2_I1 and M2_I2, upper power lines M2_R, and a routing line M2_O. Each of the first and second upper lines M2_I1 and M2_I2 may extend from the first active region PR toward the second active region NR. In some embodiments, none of the first and second upper lines M2_I1 and M2_I2 extend outward beyond the first cell boundary CB1. In some embodiments, none of the first and second upper lines M2_I1 and M2_I2 extend outward beyond the second cell boundary CB2. For example, each of the first and second upper lines M2_I1 and M2_I2 may have one terminal end on the first active region PR and an opposite terminal end on the second active region NR.

In one embodiment, none of the first and second upper lines M2_I1 and M2_I2 overlap the gate electrode GE. Each of the first and second upper lines M2_I1 and M2_I2 may be offset in the second direction D2 from the gate electrode GE adjacent thereto. For example, when viewed in plan, the first upper line M2_I1 may be disposed between the separation structure DB and the gate electrode GE. When viewed in plan, the second upper line M2_I2 may be disposed between a pair of adjacent gate electrodes GE.

The first and second upper lines M2_I1 and M2_I2 may be electrically connected through the second vias V2 to the first to fourth lower lines M1_I1 to M1_I4. The first and second upper lines M2_I1 and M2_I2 may electrically connect PMOSFET transistors of the first active region PR to NMOSFET transistors of the second active region NR. The first and second upper lines M2_I1 and M2_I2 in the logic cell LC may be connection lines that constitute a logic circuit of the logic cell LC.

The routing line M2_O may extend outward beyond the first cell boundary CB1 or the second cell boundary CB2. The routing line M2_O may extend onto a different logic cell that is adjacent in the first direction D1 to the logic cell LC. For example, the routing line M2_O may connect a logic circuit of the logic cell LC to a logic circuit of a different logic cell.

The routing line M2_O may be electrically connected through the second via V2 to the pin line M1_P. Signals from outside the logic cell LC may be input through the routing line M2_O to the pin line M1_P. The logic cell LC may be configured such that the pin line M1_P outputs signals through the routing line M2_O.

A pair of upper power lines M2_R may be provided to the gate electrode GE. The pair of upper power lines M2_R may be aligned in the first direction D1 along the gate electrode GE. For example, when viewed in plan, the pair of upper power lines M2_R may overlap the gate electrode GE. A first one of the pair of upper power lines M2_R may be electrically connected through the second via V2 to the first lower power line M1_R1. A second one of the pair of upper power lines M2_R may be electrically connected through the second via V2 to the second lower power line M1_R2 (see FIG. 10D).

A pair of upper power lines M2_R may be additionally provided on the separation structure DB. The pair of upper power lines M2_R may be aligned in the first direction D1 along the separation structure DB (see FIG. 10E). For example, when viewed in plan, the pair of upper power lines M2_R may overlap the separation structure DB.

The first connection lines M1, the first vias V1, the second connection lines M2, and the second vias V2 may include, or be formed of, the same conductive material. For example, the first connection lines M1, the first vias V1, the second connection lines M2, and the second vias V2 may include at least one metallic material selected from aluminum, copper, tungsten, molybdenum, and cobalt. Although not shown, metal layers may be additionally stacked on the fourth interlayer dielectric layer 140. Each of the stacked metal layers may include routing lines.

FIGS. 11A, 11B, 11C, and 11D illustrate cross-sectional views respectively taken along lines A-A', B-B', C-C', and D-D' of FIG. 9, showing a semiconductor device according to some example embodiments of the present inventive concepts. In the embodiment that follows, a detailed description of technical features repetitive to those discussed above with reference to FIGS. 9 and 10A to 10D will be omitted, and differences will be discussed in detail.

Referring to FIGS. 9 and 11A to 11D, a substrate 100 may be provided which includes a first active region PR and a second active region NR. A device isolation layer ST may be provided on the substrate 100. The device isolation layer ST may define a first active pattern AP1 and a second active pattern AP2 on an upper portion of the substrate 100. The first active pattern AP1 and the second active pattern AP2 may be respectively defined on the first active region PR and the second active region NR.

The first active pattern AP1 may include first channel patterns CH1 that are vertically stacked. The stacked first channel patterns CH1 may be spaced apart from each other in a third direction D3. The stacked first channel patterns CH1 may vertically overlap each other. The second active pattern AP2 may include second channel patterns CH2 that are vertically stacked. The stacked second channel patterns CH2 may be spaced apart from each other in the third direction D3. The stacked second channel patterns CH2 may vertically overlap each other. The first and second channel patterns CH1 and CH2 may include or be formed of one or more of silicon (Si), germanium (Ge), and silicon-germanium (SiGe).

The first active pattern AP1 may further include first source/drain patterns SD1. The stacked first channel patterns CH1 may be interposed between a pair of adjacent first source/drain patterns SD1. The stacked first channel patterns CH1 may connect the pair of adjacent first source/drain patterns SD1 to each other.

The second active pattern AP2 may further include second source/drain patterns SD2. The stacked second channel patterns CH2 may be interposed between a pair of adjacent second source/drain patterns SD2. The stacked second channel patterns CH2 may connect the pair of adjacent second source/drain patterns SD2 to each other.

Gate electrodes GE may be provided to extend in a first direction D1, while running across the first and second channel patterns CH1 and CH2. A gate electrode GE may vertically overlap the first and second channel patterns CH1 and CH2. A pair of gate spacers GS may be disposed on opposite sidewalls of the gate electrode GE. A gate capping pattern GP may be provided on the gate electrode GE.

Figure 11A:
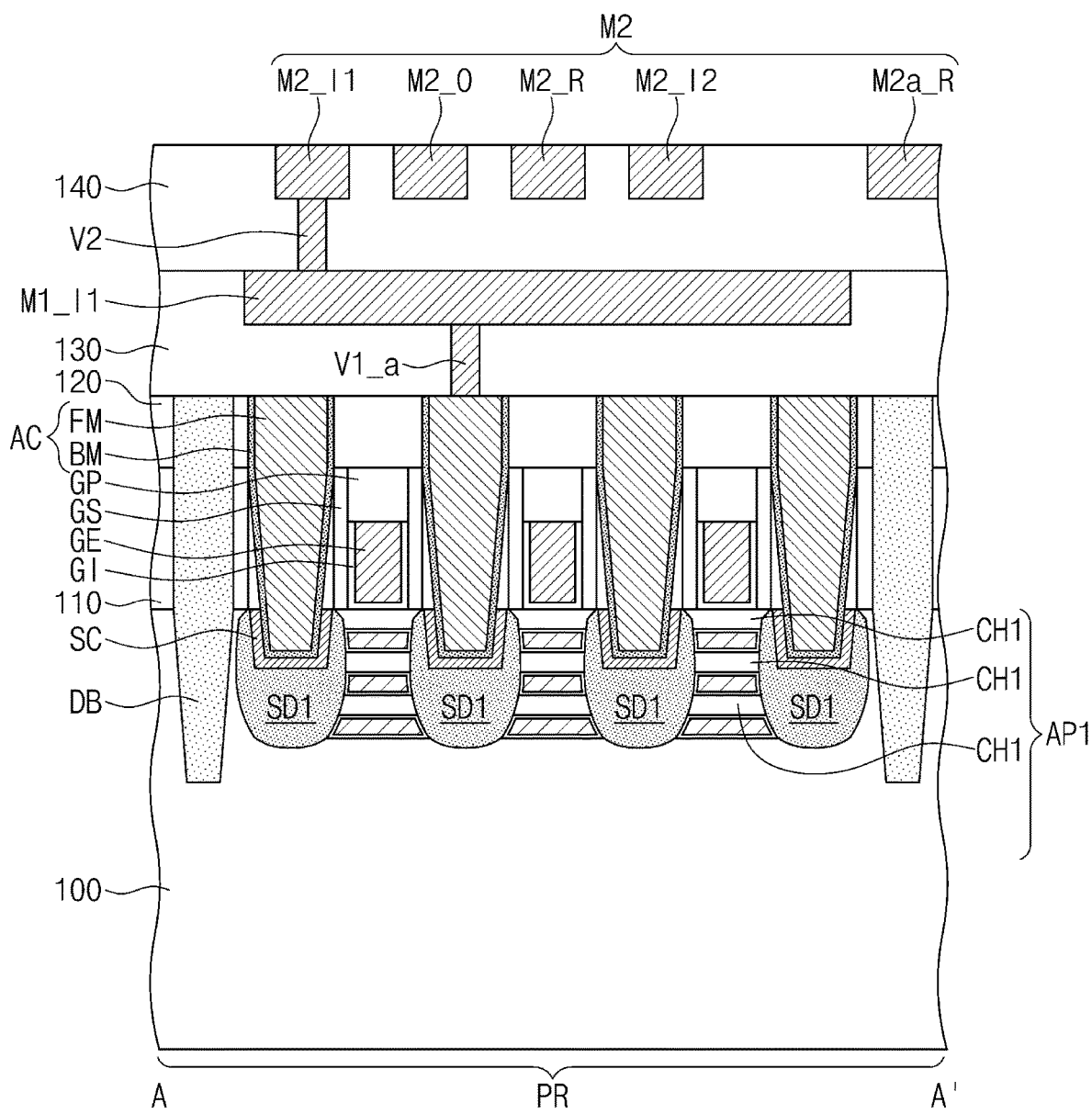
FIGS. 11A, 11B, 11C, and 11D illustrate cross-sectional views respectively taken along lines A-A', B-B', C-C', and D-D' of FIG. 9, showing a semiconductor device according to some example embodiments of the present inventive concepts.
Figure 11B:
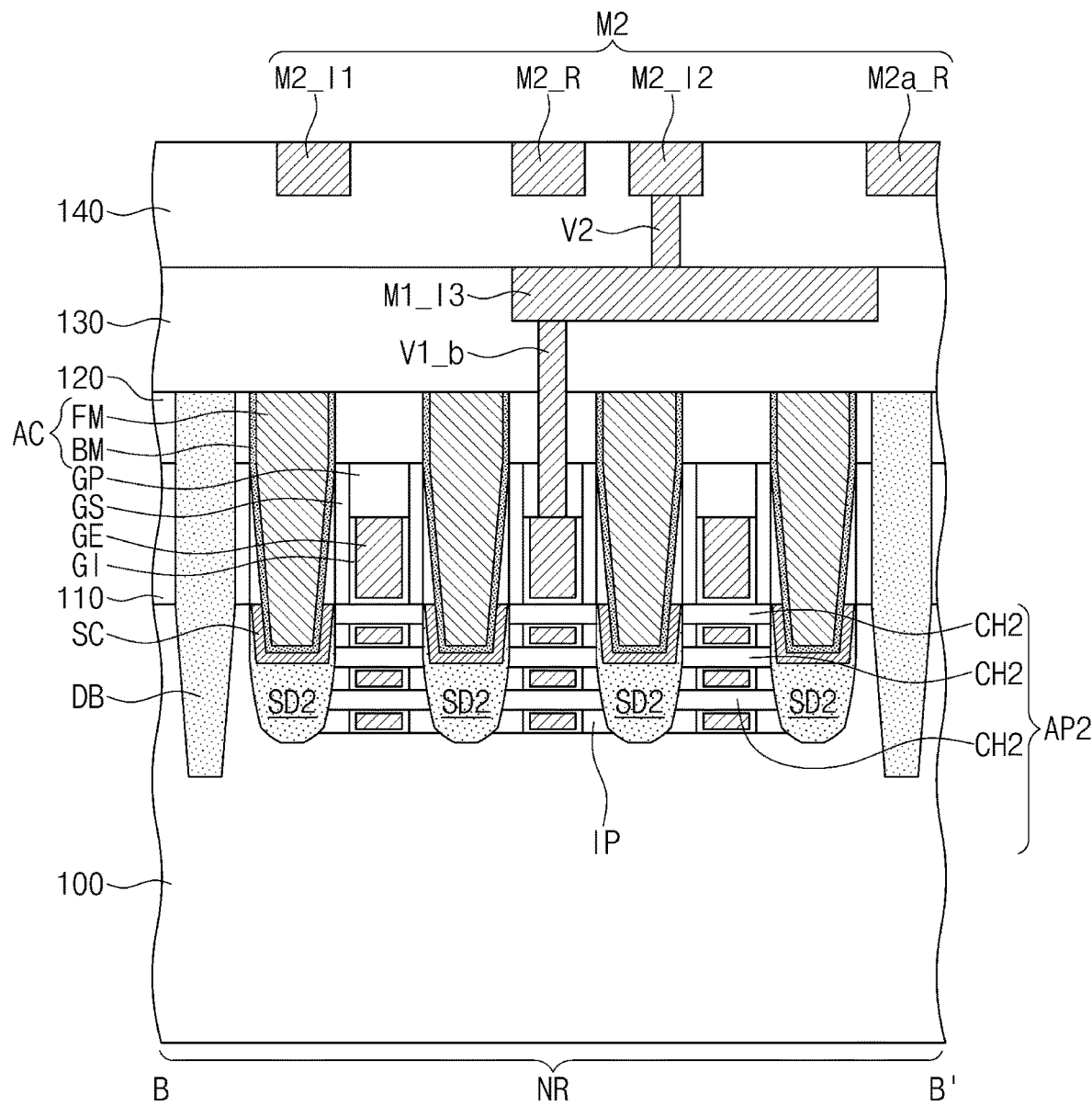
Figure 11C:
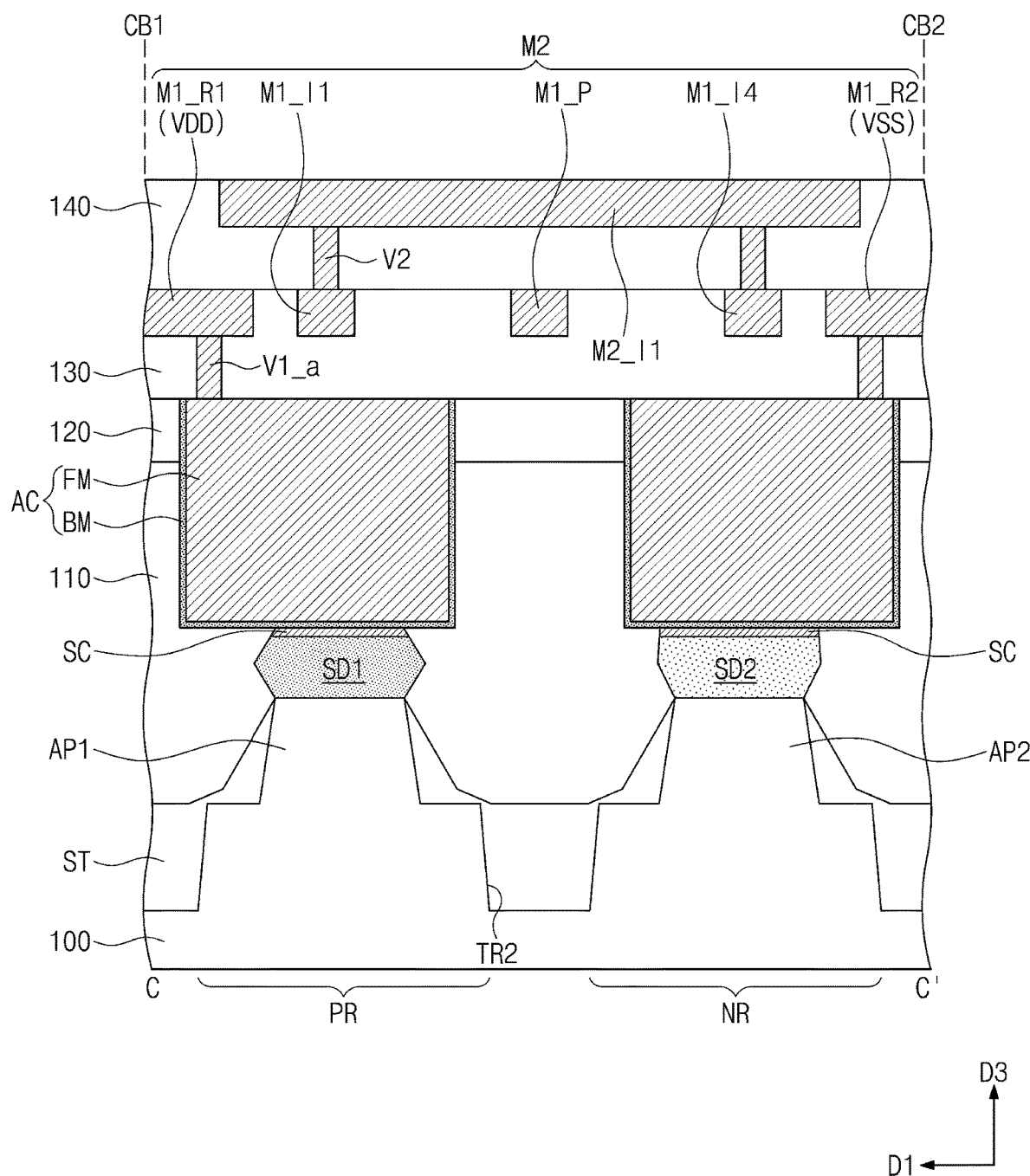
Figure 11D:
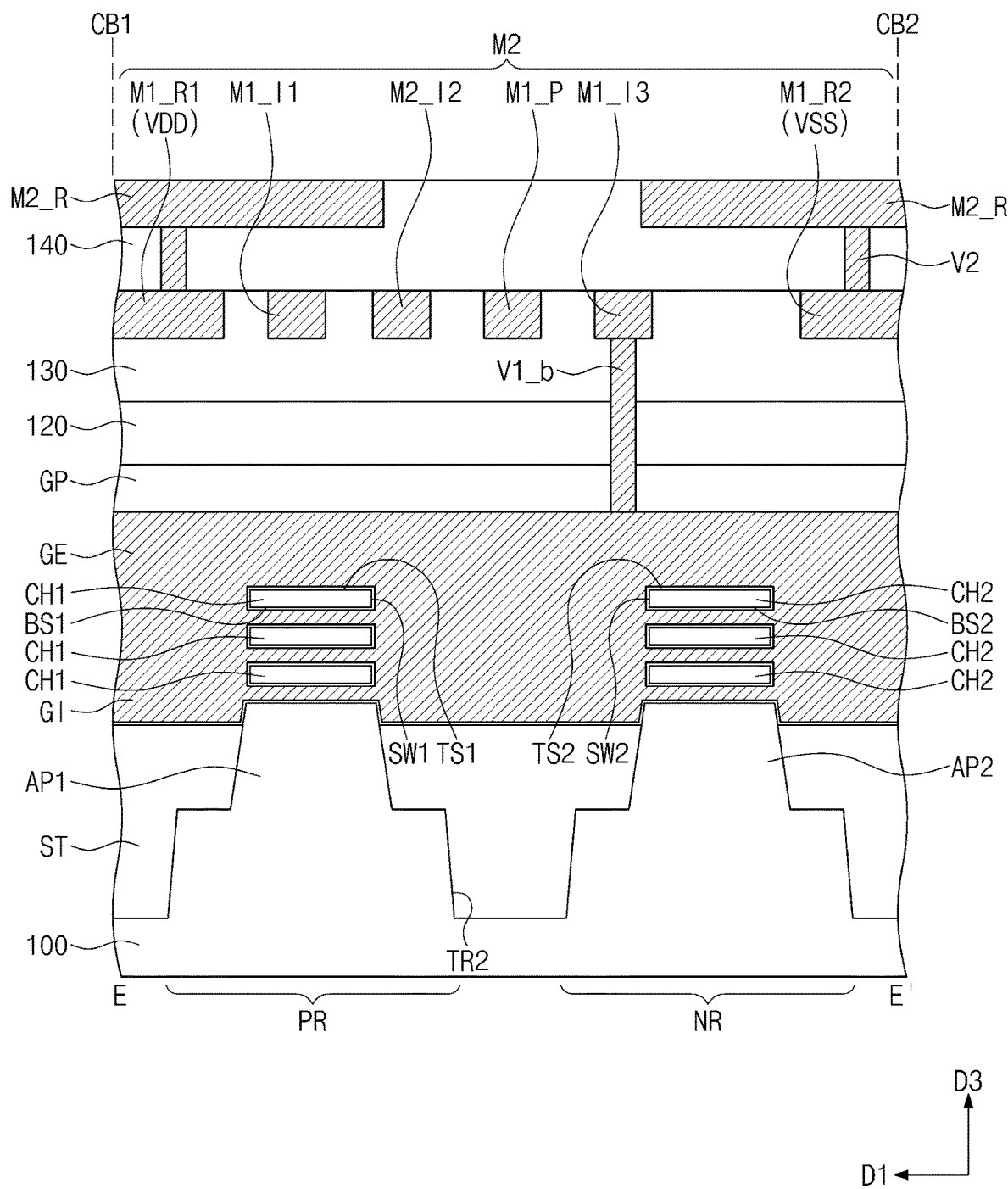

The gate electrode GE may surround each of the first and second channel patterns CH1 and CH2 (see FIG. 11D). The gate electrode GE may be provided on a first top surface TS1 of the first channel pattern CH1, at least one first sidewall SW1 of the first channel pattern CH1, and a first bottom surface BS1 of the first channel pattern CH1. The gate electrode GE may be provided on a second top surface TS2 of the second channel pattern CH2, at least one second sidewall SW2 of the second channel pattern CH2, and a second bottom surface BS2 of the second channel pattern CH2. For example, the gate electrode GE may surround a top surface, a bottom surface, and opposite sidewalls of each of the first and second channel patterns CH1 and CH2. A transistor according to the present embodiment may be a three-dimensional field effect transistor (e.g. FinFET) in which the gate electrode GE three-dimensionally surrounds the first and second channel patterns CH1 and CH2.

A gate dielectric pattern GI may be provided between the gate electrode GE and each of the first and second channel patterns CH1 and CH2. The gate dielectric pattern GI may surround each of the first and second channel patterns CH1 and CH2.

On the second active region NR, a dielectric pattern IP may be interposed between the gate dielectric pattern GI and the second source/drain pattern SD2. The gate dielectric pattern GI and the dielectric pattern IP may separate the gate electrode GE from the second source/drain pattern SD2. In contrast, the dielectric pattern IP may be omitted on the first active region PR.

A first interlayer dielectric layer 110 and a second interlayer dielectric layer 120 may be provided on an entire surface of the substrate 100. Active contacts AC may be provided to penetrate the first and second interlayer dielectric layers 110 and 120 and to correspondingly have connection with the first and second source/drain patterns SD1 and SD2.

A third interlayer dielectric layer 130 may be provided on the second interlayer dielectric layer 120. A fourth interlayer dielectric layer 140 may be provided on the third interlayer dielectric layer 130. A first metal layer may be provided in the third interlayer dielectric layer 130. The first metal layer may include first connection lines M1, first lower vias V1_a, and second lower vias V1_b. A second metal layer may be provided in the fourth interlayer dielectric layer 140. The second metal layer may include second connection lines M2 and second vias V2.

A description of the first and second metal layers may be substantially the same as that discussed above with reference to FIGS. 9 and 10A to 10D.

FIGS. 12A to 12D, 13A, 13B, and 14 illustrate plan views showing a semiconductor device according to some example embodiments of the present inventive concepts. It should be noted that a semiconductor device, as described herein, may be in the form of a semiconductor chip formed from a wafer and including an integrated circuit (including the components specifically described herein) formed on a die. A semiconductor device may also refer to a semiconductor package including one or more semiconductor devices on a package substrate and encapsulated by an encapsulant, or a package-on-package device. FIGS. 12A to 12D, 13A, 13B, and 14 exemplarily show lower and upper power lines on logic cells that are arranged two-dimensionally. FIGS. 12A to 12D, 13A, 13B, and 14 omit illustrations of first and second connection lines except for lower and upper power lines. In the embodiments that follow, a detailed description of technical features repetitive to those discussed above with reference to FIGS. 8, 9, and 10A to 10D will be omitted, and differences will be discussed in detail.

Figure 12A:
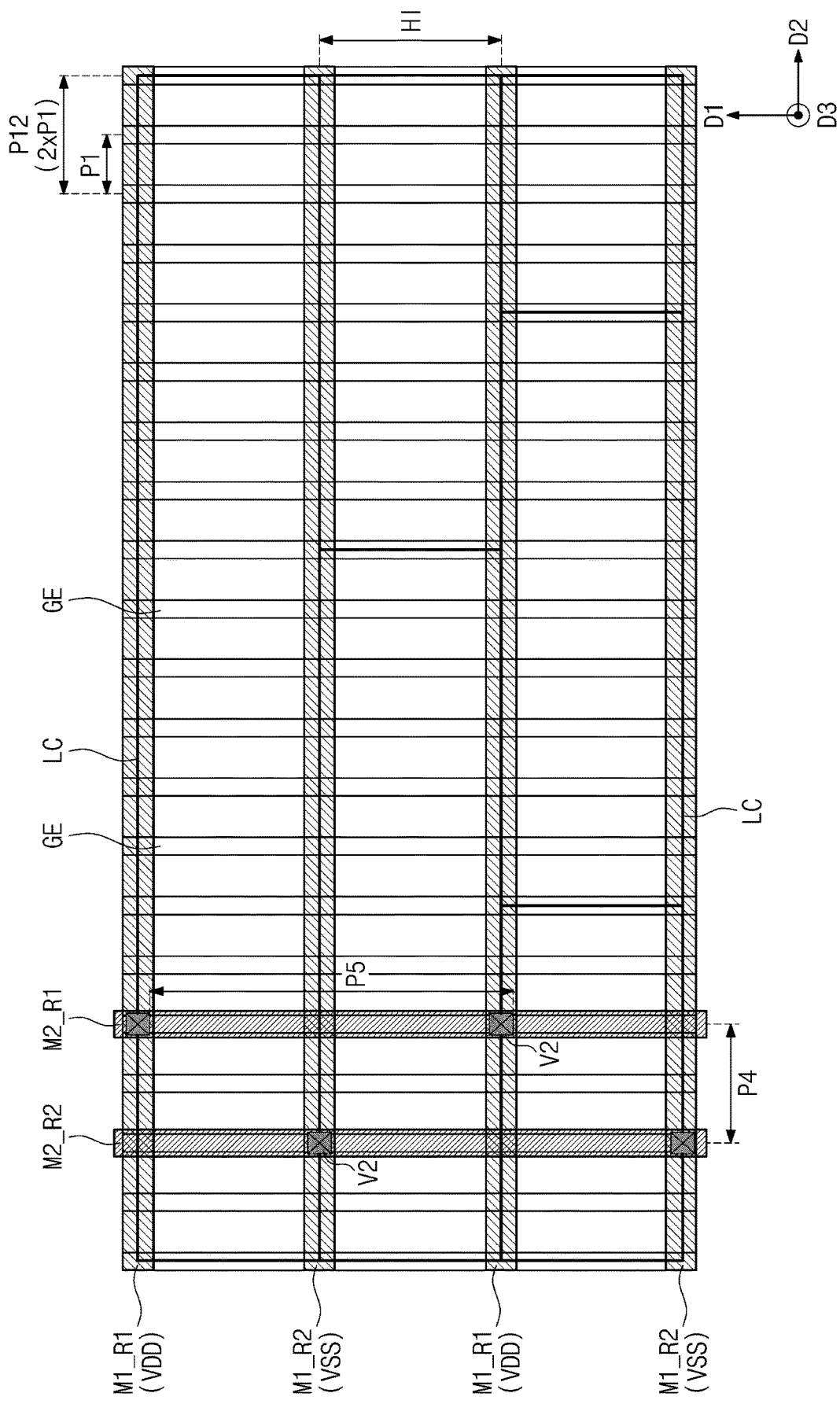

Referring to FIG. 12A, logic cells LC may be provided on a logic region of a substrate. The logic cells LC may be two-dimensionally arranged on the substrate. Each of the logic cells LC according to the present embodiment may include substantially the same components as those of the logic cell LC discussed above with reference to FIGS. 9 and 10A to 10D (or FIGS. 9 and 11A-11D), but the size in the second direction D2 is different between the logic cell LC of the present embodiment and the logic cell LC of FIGS. 9 and 10A to 10D.

For the purposes of this discussion only, length in the first direction D1 of the logic cell LC may be defined as a height HI of the logic cell LC. Each of the logic cells LC shown in FIG. 12A may have the same height HI.

The logic cells LC may be provided thereon with gate electrodes GE that extend in the first direction D1. The gate electrodes GE may be arranged along the second direction D2 at a first pitch P1.

A pitch P12 may be provided between a pair of gate electrodes GE that are spaced apart from each other across a particular gate electrode GE (e.g., spaced apart to be on opposite sides of a particular gate electrode between the two gate electrodes GE, where the pair of gate electrodes GE are the closest gate electrodes to the particular gate electrode between them). The pitch P12 may be twice the first pitch P1 (i.e., P12=2×P1).

First and second lower power lines M1_R1 and M1_R2 may be provided on the logic cells LC. The first lower power lines M1_R1 and the second lower power lines M1_R2 may be disposed alternately along the first direction D1. The first and second lower power lines M1_R1 and M1_R2 may extend parallel to each other in the second direction D2. A power voltage VDD may be applied to the first lower power lines M1_R1. A ground voltage VSS may be applied to the second lower power lines M1_R2. For example, the first lower power lines M1_R1 may be configured to receive a power voltage VSS from a power source, and the second lower power lines M1_R2 may be configured to receive a ground voltage VSS from a ground source. A pitch between the first lower power line M1_R1 and its adjacent second lower power line M1_R2 may be substantially the same as the height HI of the logic cell LC.

A first upper power line M2_R1 and a second upper power line M2_R2 may be provided on the first and second lower power lines M1_R1 and M1_R2. The first and second upper power lines M2_R1 and M2_R2 may extend parallel to each other in the first direction D1.

Differently from the upper power lines M2_R discussed above with reference to FIGS. 9 and 10A to 10D, the first and second upper power lines M2_R1 and M2_R2 may continuously extend in the first direction D1 without being broken. For example, each of the first and second lower power lines M1_R1 and M1_R2 may have a length in the first direction D1 greater than twice the height HI of the logic cell LC.

The first upper power line M2_R1 may be electrically connected through second vias V2 to the first lower power lines M1_R1. The second upper power line M2_R2 may be electrically connected through second vias V2 to the second lower power lines M1_R2.

A fifth pitch P5 in the first direction D1 may be provided between a first lower power line M1_R1 and the second via V2. The fifth pitch P5 may be twice the height HI of the logic cell LC. Likewise, the fifth pitch P5 in the first direction D1 may be provided between a second lower power line M1_R2 and a second via V2.

A fourth pitch P4 may be provided between the first upper power line M2_R1 and the second upper power line M2_R2 that are adjacent to each other. In the present embodiment, the fourth pitch P4 may be substantially the same as the pitch P12. The first and second upper power lines M2_R1 and M2_R2 arranged at the fourth pitch P4 may be disposed repeatedly at an interval greater than 10×P12 on the logic cells LC.

Although not shown, one or more of the gate electrodes GE may be replaced with the separation structure DB discussed above with reference to FIGS. 9 and 10A to 10D. In such cases, when viewed in plan, at least one of the first and second upper power lines M2_R1 and M2_R2 may overlap the separation structure DB.

Referring to FIG. 12B, the fourth pitch P4 between the first upper power line M2_R1 and its adjacent second upper power line M2_R2 may be twice the pitch P12. Except for the fourth pitch P4, other configurations are the same as those discussed above in FIG. 12A.

Referring to FIG. 12C, the fourth pitch P4 between the first upper power line M2_R1 and its adjacent second upper power line M2_R2 may be three times the pitch P12. Except for the fourth pitch P4, other configurations are the same as those discussed above in FIG. 12A.

Figure 12D:
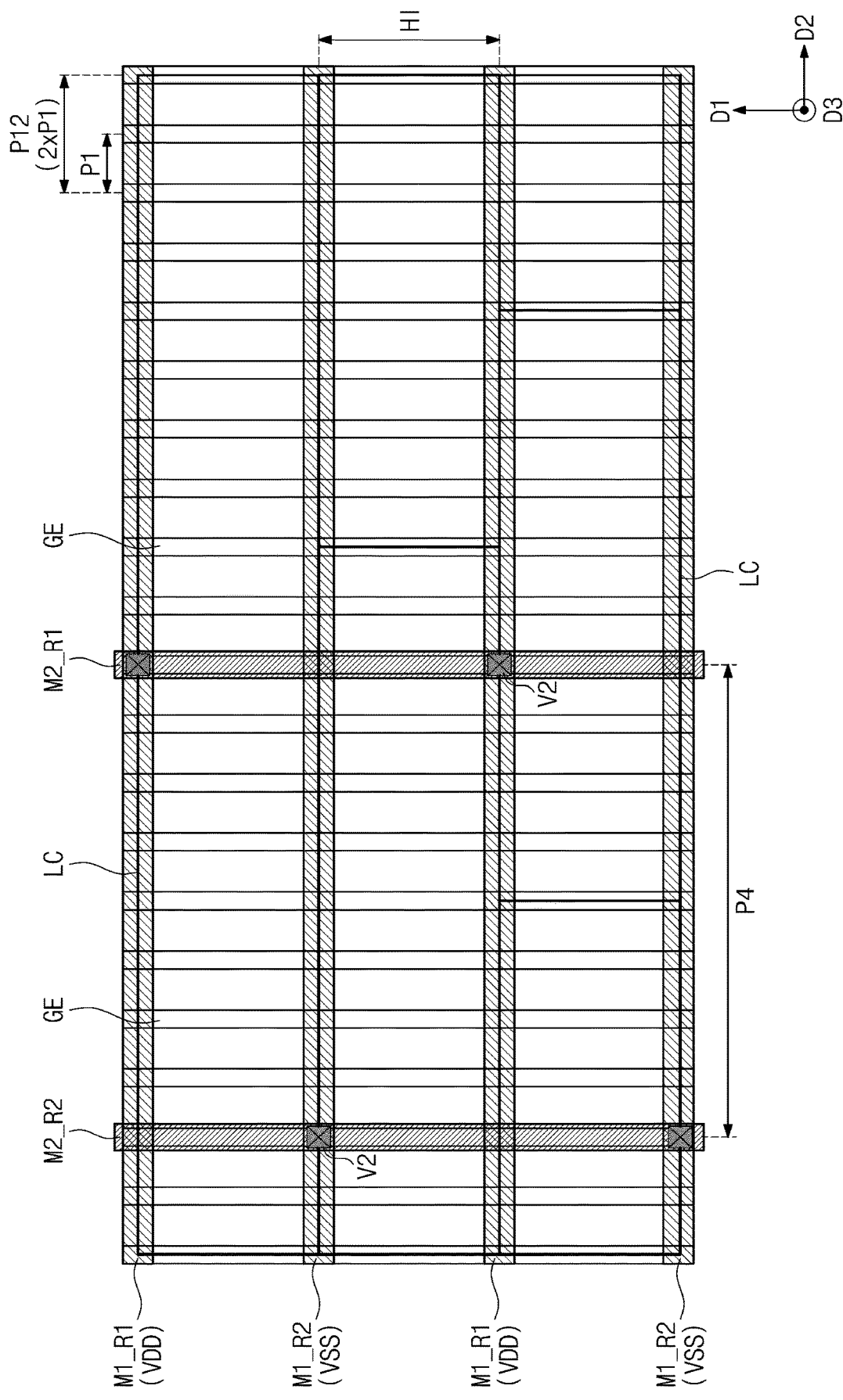

Referring to FIG. 12D, the fourth pitch P4 between the first upper power line M2_R1 and its adjacent second upper power line M2_R2 may be four times the pitch P12. Except for the fourth pitch P4, other configurations are the same as those discussed above in FIG. 12A.

Referring to FIG. 13A, the second upper power line M2_R2 may be additionally provided on the structure of FIG. 12A. The first upper power line M2_R1 may be interposed between a pair of second upper power lines M2_R2. The fourth pitch P4 may be provided between the first upper power line M2_R1 and the second upper power line M2_R2 that are adjacent to each other. In the present embodiment, the fourth pitch P4 may be substantially the same as the pitch P12.

Figure 13B:
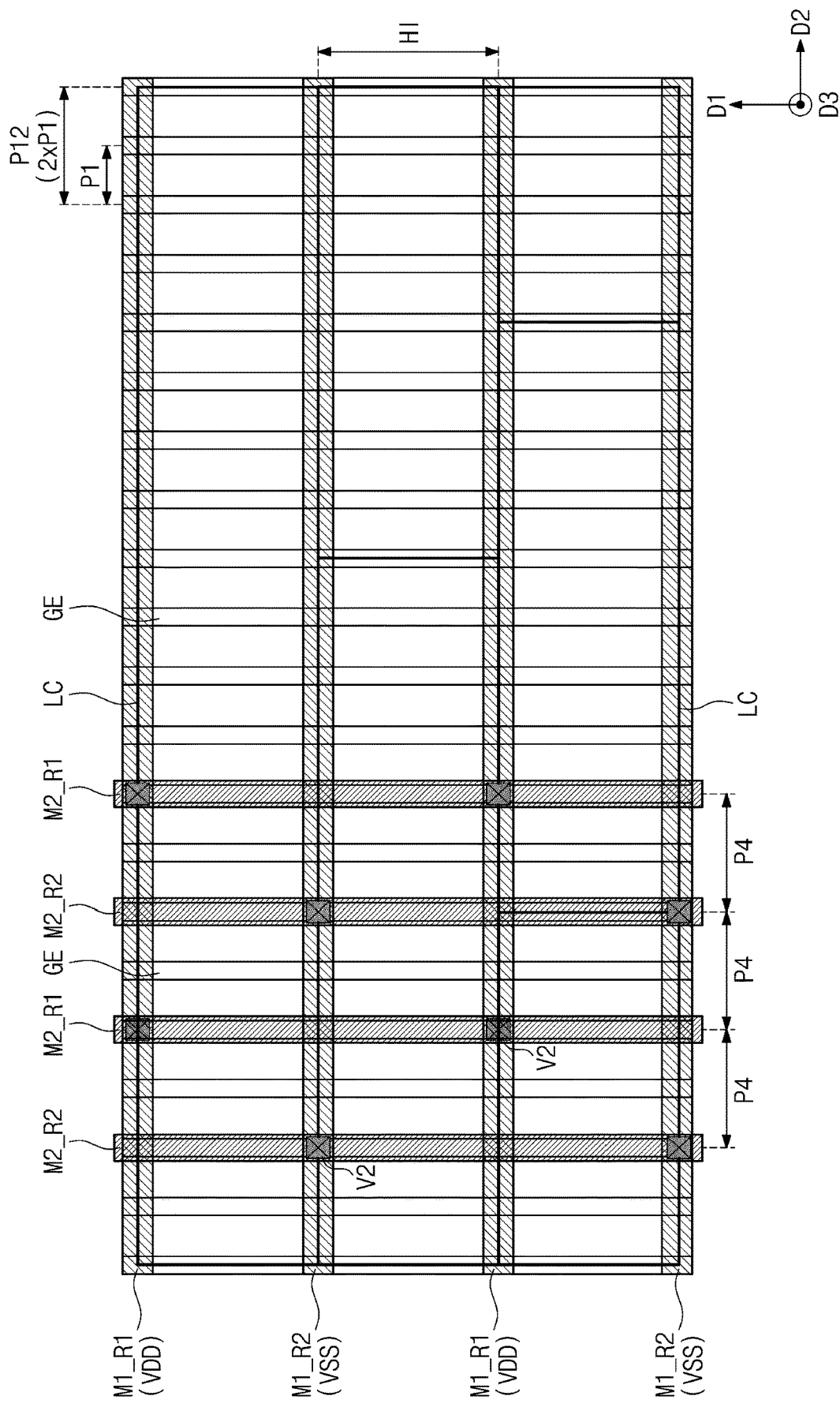

Referring to FIG. 13B, the first upper power line M2_R1 may be additionally provided on the structure of FIG. 13A. The first upper power lines M2_R1 and the second upper power lines M2_R2 may be disposed alternately along the second direction D2. The fourth pitch P4 may be provided between the first upper power line M2_R1 and the second upper power line M2_R2 that are adjacent to each other. In the present embodiment, the fourth pitch P4 may be substantially the same as the pitch P12.

Figure 14:
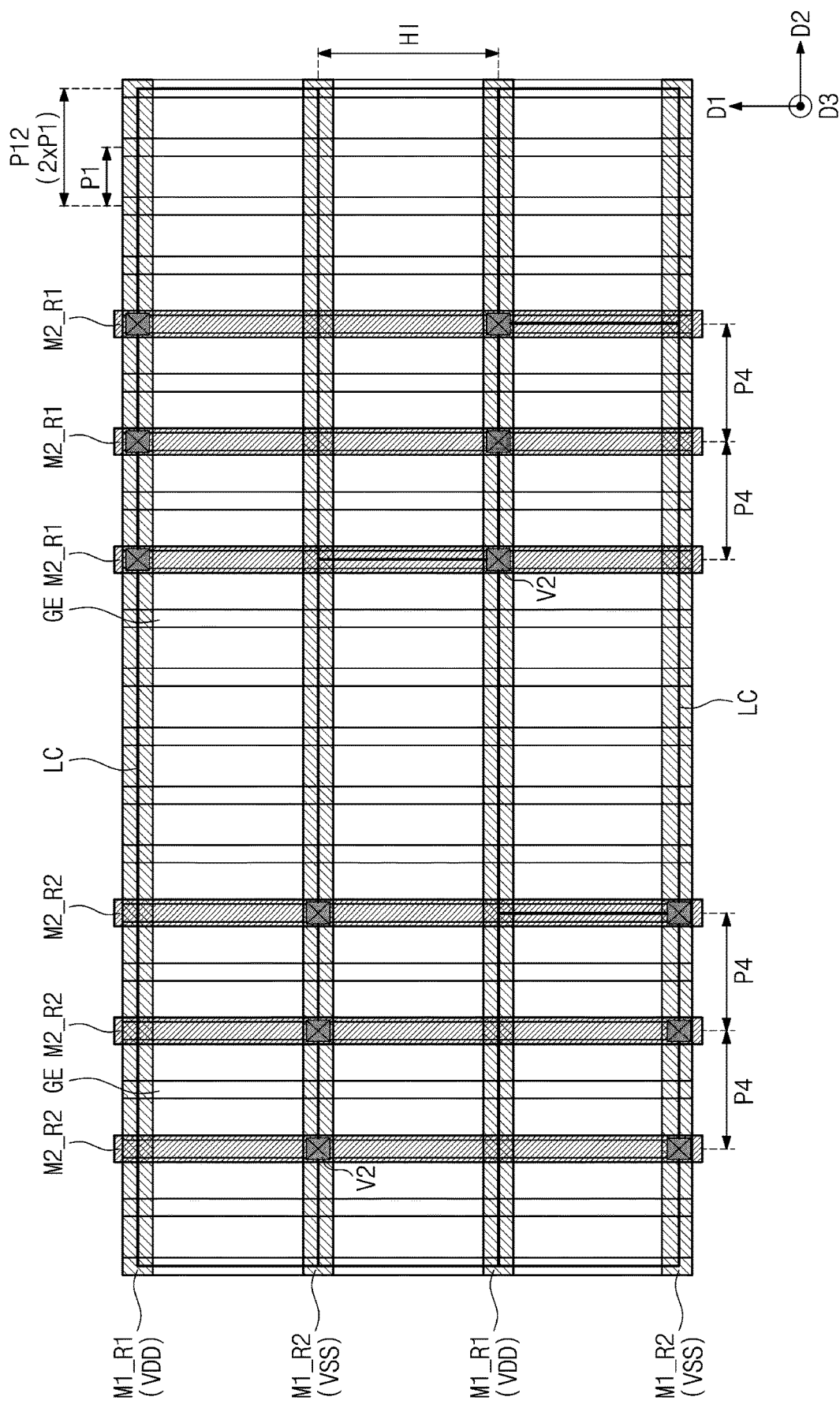

Referring to FIG. 14, three first upper power lines M2_R1 and three second upper power lines M2_R2 may be provided on the logic cells LC. The three first upper power lines M2_R1 may be disposed adjacent to each other. The fourth pitch P4 may be provided between the three first upper power lines M2_R1. The three second upper power lines M2_R2 may be disposed adjacent to each other. The fourth pitch P4 may be provided between the three second upper power lines M2_R2.

The three first upper power lines M2_R1 may be spaced apart in the second direction D2 from the three second upper power lines M2_R2. A pitch between a power line of the three first upper power lines M2_R1 closest to the three second upper power lines M2_R2 and a power line of the three second upper power lines M2_R2 closest to the three upper power lines M2_R1 may be three times the fourth pitch P4.

According to the present inventive concepts, a method of designing a semiconductor device may prevent collision between an upper power pattern and an upper line pattern when standard cells are placed. Therefore, an empty space may be prevented from being undesirably created when the standard cells are placed. As a result, a semiconductor device according to the present inventive concepts may increase in integration and electrical characteristics.

Although some example embodiments of the present inventive concepts have been discussed with reference to accompanying figures, it will be understood that various changes in form and details may be made therein without departing from the spirit and scope of the present inventive concepts. It therefore will be understood that the embodiments described above are just illustrative but not limitative in all aspects.

What is claimed is:

1. A semiconductor device, comprising:
a logic cell on a substrate, the logic cell including a first active region and a second active region that are spaced apart from each other in a first horizontal direction;
a first active pattern and a second active pattern on the first active region and the second active region, respectively, the first and second active patterns each extending in a second horizontal direction that intersects the first horizontal direction;
a plurality of gate electrodes that extend in the first horizontal direction and that each run across the first active pattern and the second active pattern;
a plurality of first connection lines in a first interlayer dielectric layer on the gate electrodes, the first connection lines extending parallel to each other in the second horizontal direction; and
a plurality of second connection lines in a second interlayer dielectric layer on the first interlayer dielectric layer, the second connection lines extending parallel to each other in the first horizontal direction,
wherein the logic cell has a first cell boundary and a second cell boundary that extend in the second horizontal direction, the first cell boundary and second cell boundary being opposite to each other in the first horizontal direction,
wherein the first connection lines include:
a first lower power line that extends in the second horizontal direction along the first cell boundary; and
a second lower power line that extends in the second horizontal direction along the second cell boundary, and
wherein the second connection lines include:
a first upper power line that vertically overlaps a first gate electrode of the gate electrodes; and
an upper line disposed between the first gate electrode and a second gate electrode of the gate electrodes, when viewed in a plan view,
wherein the first upper power line is electrically connected to at least one of the first lower power line and the second lower power line, and
wherein the first active pattern and second active pattern are at a first vertical level, the plurality of first connection lines are at a second vertical level, and the plurality of second connection lines are at a third vertical level, the second vertical level between the first vertical level and the third vertical level.

2. The semiconductor device of claim 1, wherein
the upper line extends from the first active region to the second active region, and
the upper line does not extend outward beyond the first cell boundary or the second cell boundary.

3. The semiconductor device of claim 1, wherein the upper line does not vertically overlap any of the gate electrodes.

4. The semiconductor device of claim 1, wherein, when viewed in plan view, the upper line is offset in the second horizontal direction from each of the gate electrodes.

5. The semiconductor device of claim 1, further comprising a separation structure on at least one side of the logic cell,
wherein the separation structure penetrates an upper portion of each of the first active pattern and second active pattern, and
wherein the second connection lines further include a second upper power line that vertically overlaps the separation structure.

6. The semiconductor device of claim 1, further comprising a first source/drain pattern and a second source/drain pattern on an upper portion of the first active pattern and an upper portion of the second active pattern, respectively,
- wherein the first connection lines further include a plurality of lower lines between the first and second lower power lines,
- wherein a first lower line of the lower lines is electrically connected either to the first source/drain pattern or to the second source/drain pattern, and
- wherein a second lower line of the lower lines is electrically connected to at least one of the gate electrodes.

7. The semiconductor device of claim 6, wherein
- the gate electrodes are arranged in the second horizontal direction at a first pitch,
- the lower lines are arranged in the first horizontal direction at a second pitch,
- the second connection lines are arranged in the second horizontal direction at a third pitch,
- the third pitch is less than the first pitch, and
- the third pitch is greater than the second pitch.

8. The semiconductor device of claim 1, wherein the second connection lines further include a routing line that extends outward beyond at least one of the first cell boundary and the second cell boundary.

9. The semiconductor device of claim 1, further comprising a device isolation layer that covers lower sidewalls of the first and second active patterns,
- wherein an upper portion of each of the first and second active patterns vertically protrudes beyond a top surface of the device isolation layer.

10. The semiconductor device of claim 1, wherein
- the first active pattern includes a plurality of first channel patterns that are vertically stacked,
- the second active pattern includes a plurality of second channel patterns that are vertically stacked,
- the first gate electrode is on a top surface, a bottom surface, and opposite sidewalls of each of the first channel patterns, and
- the second gate electrode is on a top surface, a bottom surface, and opposite sidewalls of each of the second channel patterns.

11. A semiconductor device, comprising:
- a logic cell formed on a substrate and that includes a PMOSFET area and an NMOSFET area on the substrate, the PMOSFET and NMOSFET areas being spaced apart from each other in a first horizontal direction;
- a separation structure on at least one side of the logic cell, the separation structure extending in the first horizontal direction and separating the logic cell from an adjacent logic cell;
- a plurality of first connection lines in a first interlayer dielectric layer on the logic cell, the first connection lines extending parallel to each other in a second horizontal direction that intersects the first horizontal direction; and
- a plurality of second connection lines in a second interlayer dielectric layer on the first interlayer dielectric layer, the second connection lines extending parallel to each other in the first horizontal direction,
- wherein the plurality of first connection lines are at a second vertical level between a first vertical level at which the substrate is disposed and a third vertical level at which the plurality of second connection lines are disposed,
- wherein the first connection lines include:
  - a first lower power line that extends horizontally along a first cell boundary of the logic cell; and
  - a second lower power line that extends horizontally along a second cell boundary of the logic cell,
- wherein the first cell boundary is opposite in the first horizontal direction to the second cell boundary, and
- wherein the second connection lines include a first upper power line that vertically overlaps the separation structure, and
- wherein the first upper power line is electrically connected to at least one of the first lower power line and the second lower power line.

12. The semiconductor device of claim 11, further comprising a plurality of gate electrodes that extend in the first horizontal direction and run across the PMOSFET and NMOSFET areas,
- wherein the second connection lines further include a second upper power line that vertically overlaps a first gate electrode of the gate electrodes.

13. The semiconductor device of claim 11, further comprising a plurality of gate electrodes that extend in the first horizontal direction and run across the PMOSFET and NMOSFET areas,
- wherein, when viewed in plan, the second connection lines further include an upper line that is offset in the second horizontal direction from each of the gate electrodes,
- wherein the upper line does not extend outward beyond the first cell boundary and the second cell boundary.

14. The semiconductor device of claim 13, wherein the upper line does not vertically overlap any of the gate electrodes.

15. The semiconductor device of claim 13, wherein the second connection lines further include a routing line that extends outward beyond at least one of the first cell boundary and second cell boundary.

16. A semiconductor device, comprising:
- a logic cell on a substrate, the logic cell including a first active region and a second active region that are spaced apart from each other in a first horizontal direction;
- a first active pattern and a second active pattern on the first active region and the second active region, respectively, the first and second active patterns each extending in a second horizontal direction that intersects the first horizontal direction;
- a device isolation layer that covers lower sidewalls of the first active pattern and lower sidewalls of the second active pattern, an upper portion of each of the first and second active patterns vertically protruding beyond a top surface of the device isolation layer;
- a first source/drain pattern and a second source/drain pattern on the upper portion of the first active pattern and the upper portion of the second active pattern, respectively;
- a plurality of gate electrodes that extend in the first horizontal direction and run across the first and second active patterns;
- a plurality of first connection lines in a first interlayer dielectric layer on the gate electrodes; and
- a plurality of second connection lines in a second interlayer dielectric layer on the first interlayer dielectric layer, the second connection lines extending parallel to each other in the first horizontal direction, and the first interlayer dielectric layer being vertically between the second interlayer dielectric layer and the substrate,
- wherein the logic cell has a first cell boundary and a second cell boundary that extend in the second horizontal direction, the first cell boundary and the second cell boundary being opposite to each other in the first horizontal direction, wherein the first connection lines include:
- a first lower power line that extends horizontally along the first cell boundary; and
- a second lower power line that extends horizontally along the second cell boundary, wherein the second connection lines include:
- a first upper power line that vertically overlaps a first gate electrode of the gate electrodes; and
- an upper line that is offset in the second horizontal direction from each of the gate electrodes, when viewed in plan view, wherein the first upper power line is electrically connected to at least one of the first lower power line and the second lower power line, wherein the upper line extends from the first active region to the second active region, and wherein the upper line does not extend outward beyond the first cell boundary or the second cell boundary.

17. The semiconductor device of claim 16, wherein the upper line does not vertically overlap any of the gate electrodes.

18. The semiconductor device of claim 16, further comprising a separation structure on at least one side of the logic cell that separates the logic cell from an adjacent logic cell, wherein the separation structure penetrates the upper portion of each of the first and second active patterns, and wherein the second connection lines further include a second upper power line that vertically overlaps the separation structure.

19. The semiconductor device of claim 16, wherein the first connection lines further include a plurality of lower lines between the first lower power line and the second lower power line, wherein a first lower line of the lower lines is electrically connected either to the first source/drain pattern or to the second source/drain pattern, and wherein a second lower line of the lower lines is electrically connected to at least one of the gate electrodes.

20. The semiconductor device of claim 19, wherein the gate electrodes are arranged in the second horizontal direction at a first pitch, the lower lines are arranged in the first horizontal direction at a second pitch, the second connection lines are arranged in the second horizontal direction at a third pitch, the third pitch is less than the first pitch, and the third pitch is greater than the second pitch.

* * * * *